(12) United States Patent
Yan et al.

(10) Patent No.: US 12,322,698 B2
(45) Date of Patent: Jun. 3, 2025

(54) SEMICONDUCTOR MEMORY STRUCTURE AND METHOD FOR FORMING THE SAME

(71) Applicant: Winbond Electronics Corp., Taichung (TW)

(72) Inventors: Hung-Jung Yan, Tainan (TW); Ling-Chun Tseng, Taichung (TW); Chun-Chieh Wang, Taichung (TW); Tzu-Ming Ou Yang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 342 days.

(21) Appl. No.: 17/358,165

(22) Filed: Jun. 25, 2021

(65) Prior Publication Data

US 2022/0415781 A1 Dec. 29, 2022

(51) Int. Cl.
*H01L 23/528* (2006.01)
*H01L 21/768* (2006.01)
*H01L 23/522* (2006.01)
*H10B 12/00* (2023.01)

(52) U.S. Cl.
CPC ...... *H01L 23/528* (2013.01); *H01L 21/76802* (2013.01); *H01L 21/76877* (2013.01); *H01L 23/5226* (2013.01); *H10B 12/30* (2023.02)

(58) Field of Classification Search
CPC .. H10B 12/0335; H10B 12/30; H10B 12/482; H10B 12/315; H10B 12/01; H01L 21/76877; H01L 21/76802
See application file for complete search history.

(56) References Cited

U.S. PATENT DOCUMENTS

| | | |
|---|---|---|
| 8,188,529 B2 | 5/2012 | Nakamura et al. |
| 9,123,550 B2 | 9/2015 | Son |
| 9,318,379 B2 * | 4/2016 | Lee ........................ H01L 21/764 |
| 9,425,200 B2 | 8/2016 | Hwang et al. |
| 10,290,537 B2 | 5/2019 | Lee et al. |
| 10,490,444 B2 | 11/2019 | Choi et al. |
| 2012/0276711 A1 | 11/2012 | Yoon et al. |
| 2014/0231892 A1 | 8/2014 | Song et al. |
| 2016/0247711 A1 | 8/2016 | Kim |
| 2016/0351501 A1 * | 12/2016 | Chun ................ H01L 21/76897 |
| 2019/0067294 A1 * | 2/2019 | Lee ....................... H10B 12/315 |
| 2019/0221570 A1 | 7/2019 | Liu et al. |
| 2022/0077159 A1 * | 3/2022 | Li .......................... H10B 12/09 |

* cited by examiner

*Primary Examiner* — Nicholas J Tobergte
*Assistant Examiner* — Adin Hrnjic
(74) *Attorney, Agent, or Firm* — Muncy, Geissler, Olds & Lowe, P.C.

(57) ABSTRACT

A method for forming a semiconductor memory structure includes forming a plurality of conductive wire structures over a semiconductor substrate, and forming a plurality of spacer structures along the sidewalls of the conductive wire structures. Each of the spacer structures includes a first spacer. The method also includes forming a plurality of dielectric strips across the conductive wire structures, forming a plurality of conductive strips over the conductive wire structures and the dielectric strips, performing a patterning process on the conductive strips to form a plurality of conductive pads, and removing the first spacer of each of the spacer structures to form a gap in each of the spacer structures.

18 Claims, 23 Drawing Sheets

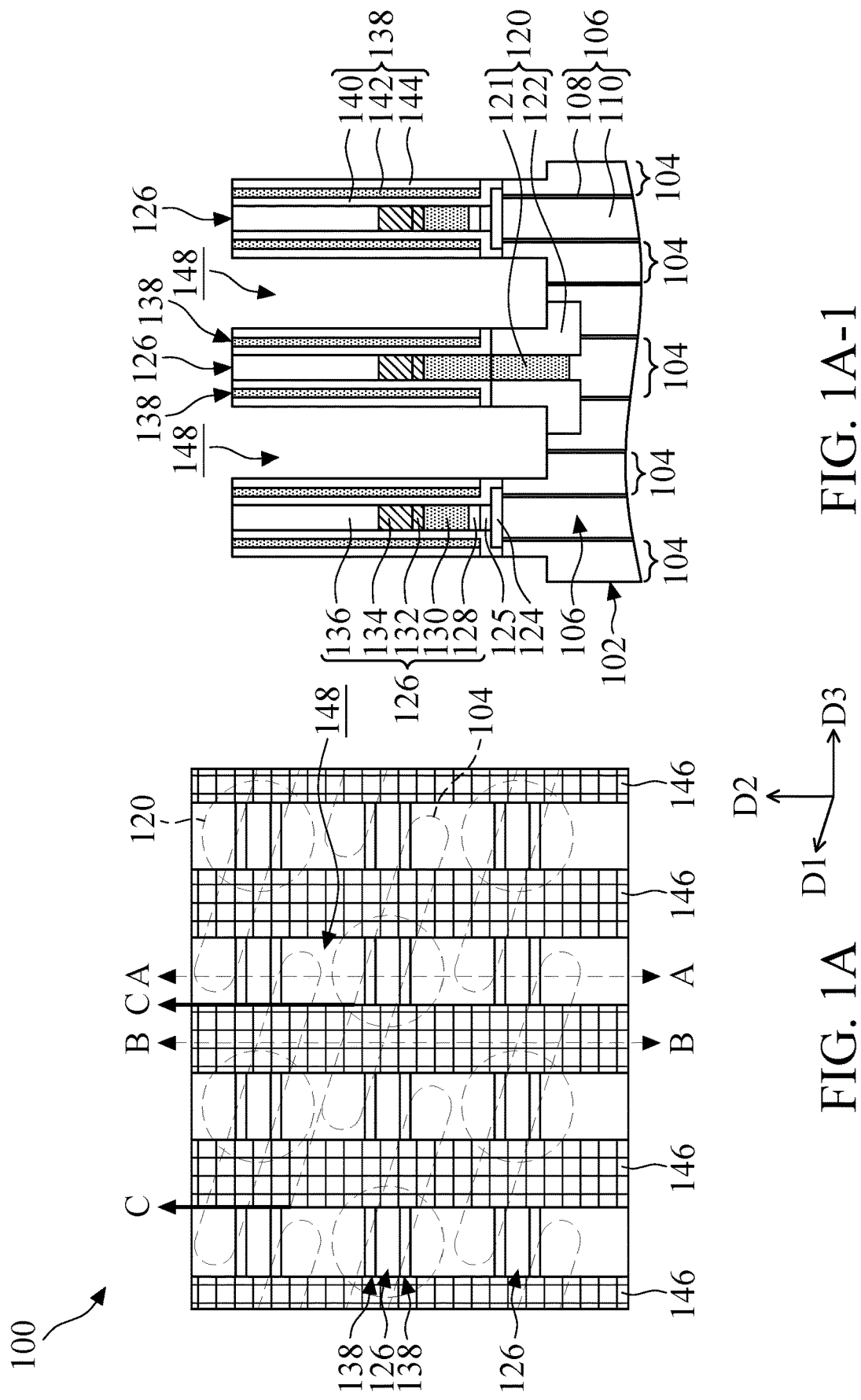

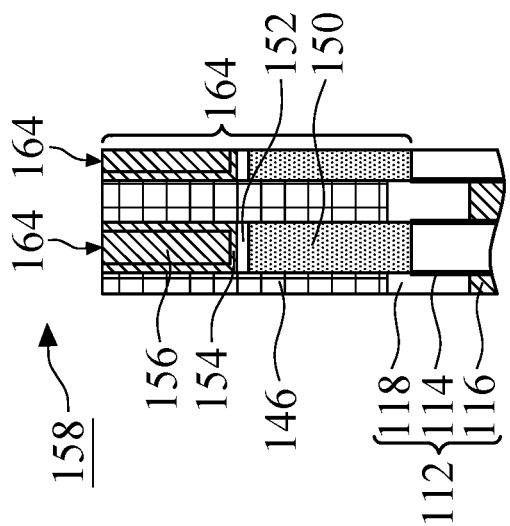
FIG. 1C-3
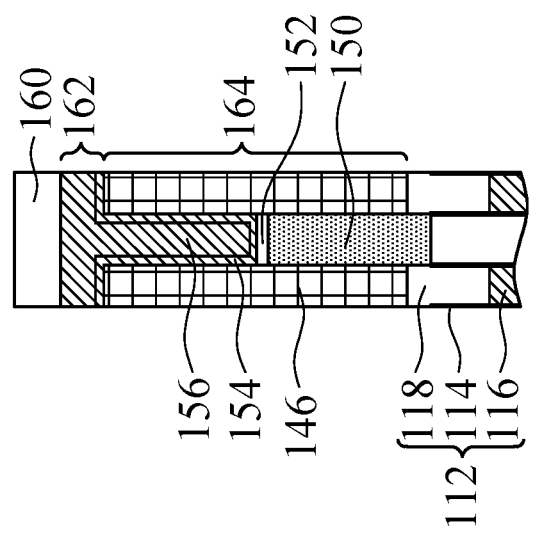
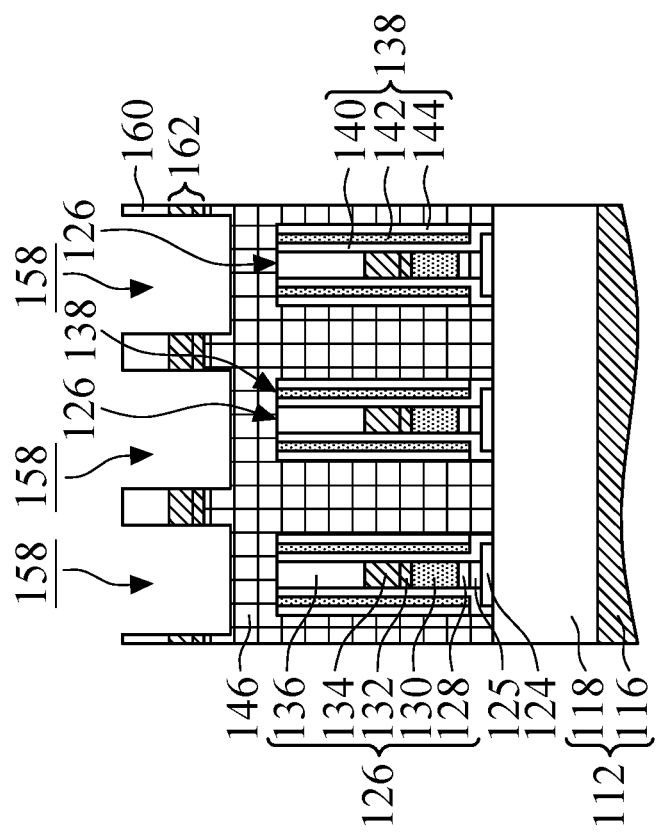
FIG. 1C-2

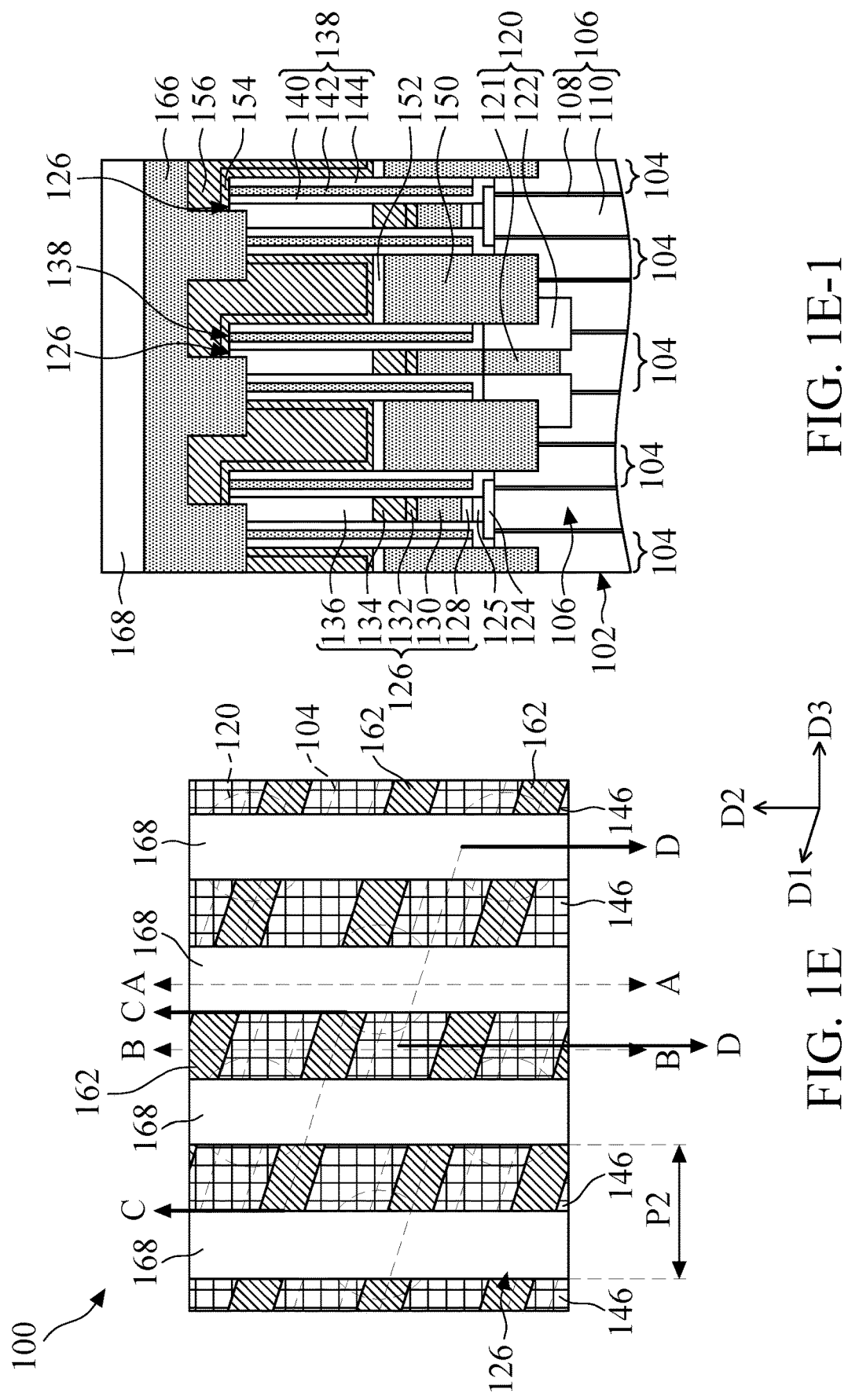

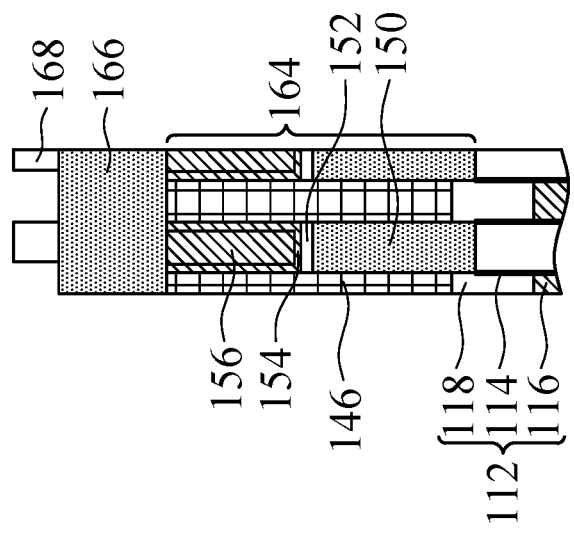
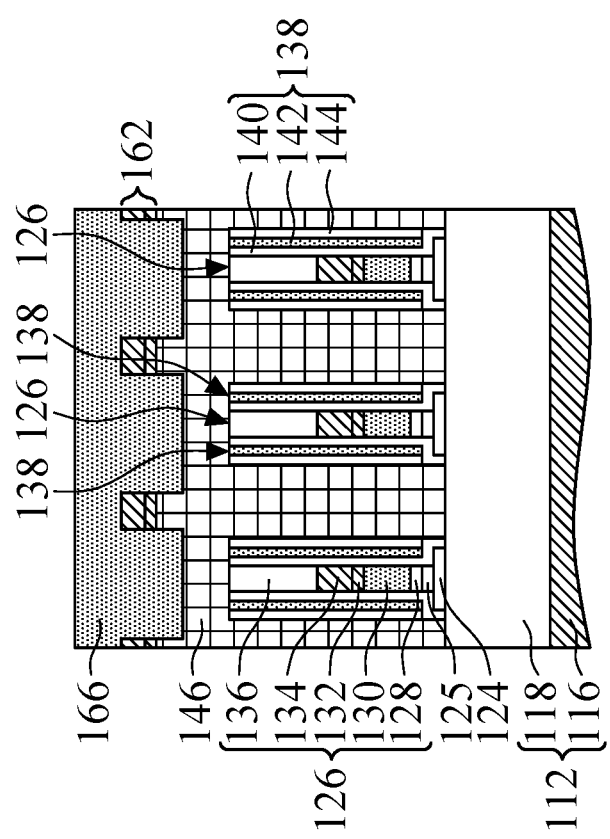
FIG. 1E-2
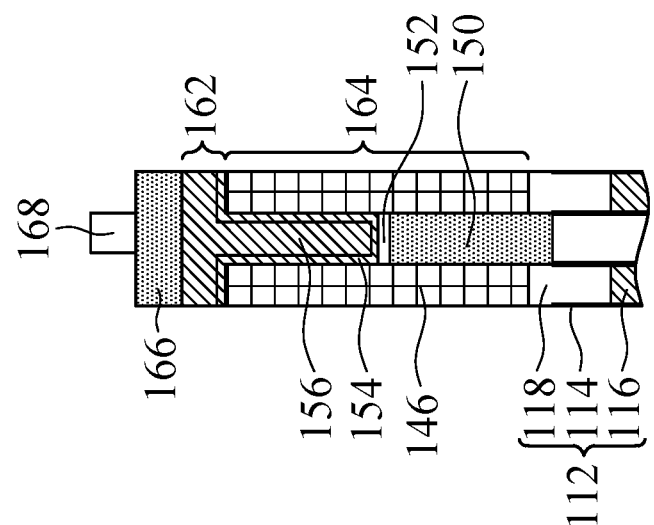
FIG. 1E-3
FIG. 1E-4

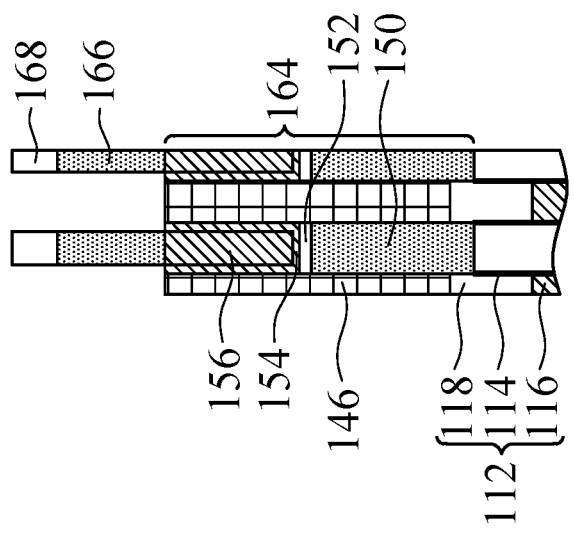
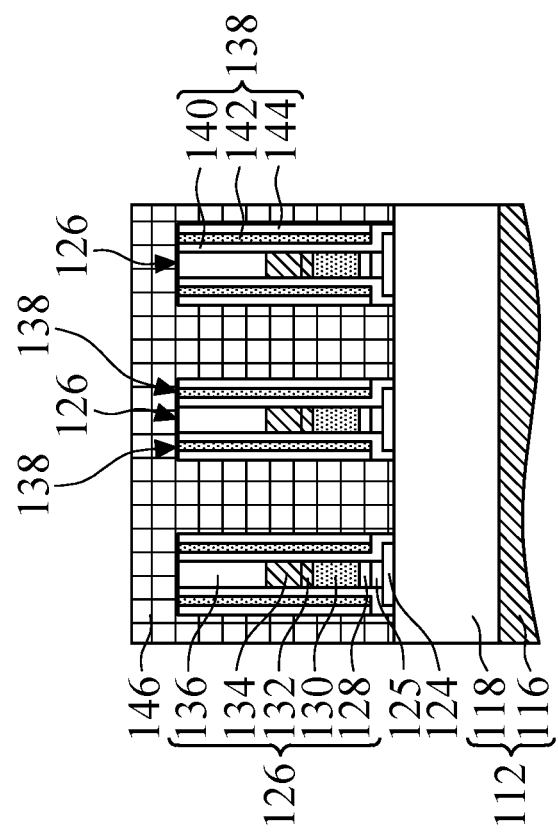
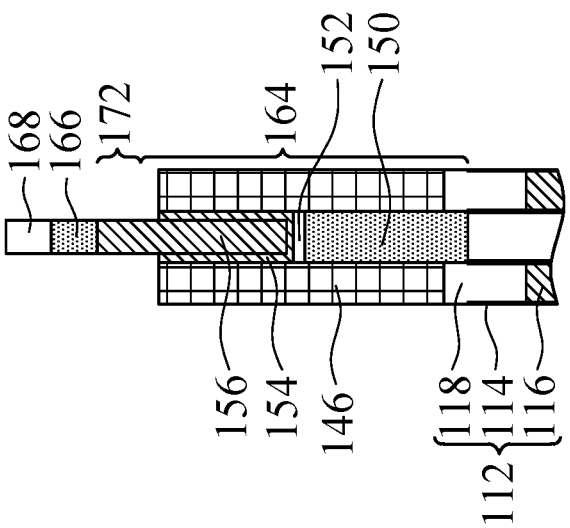

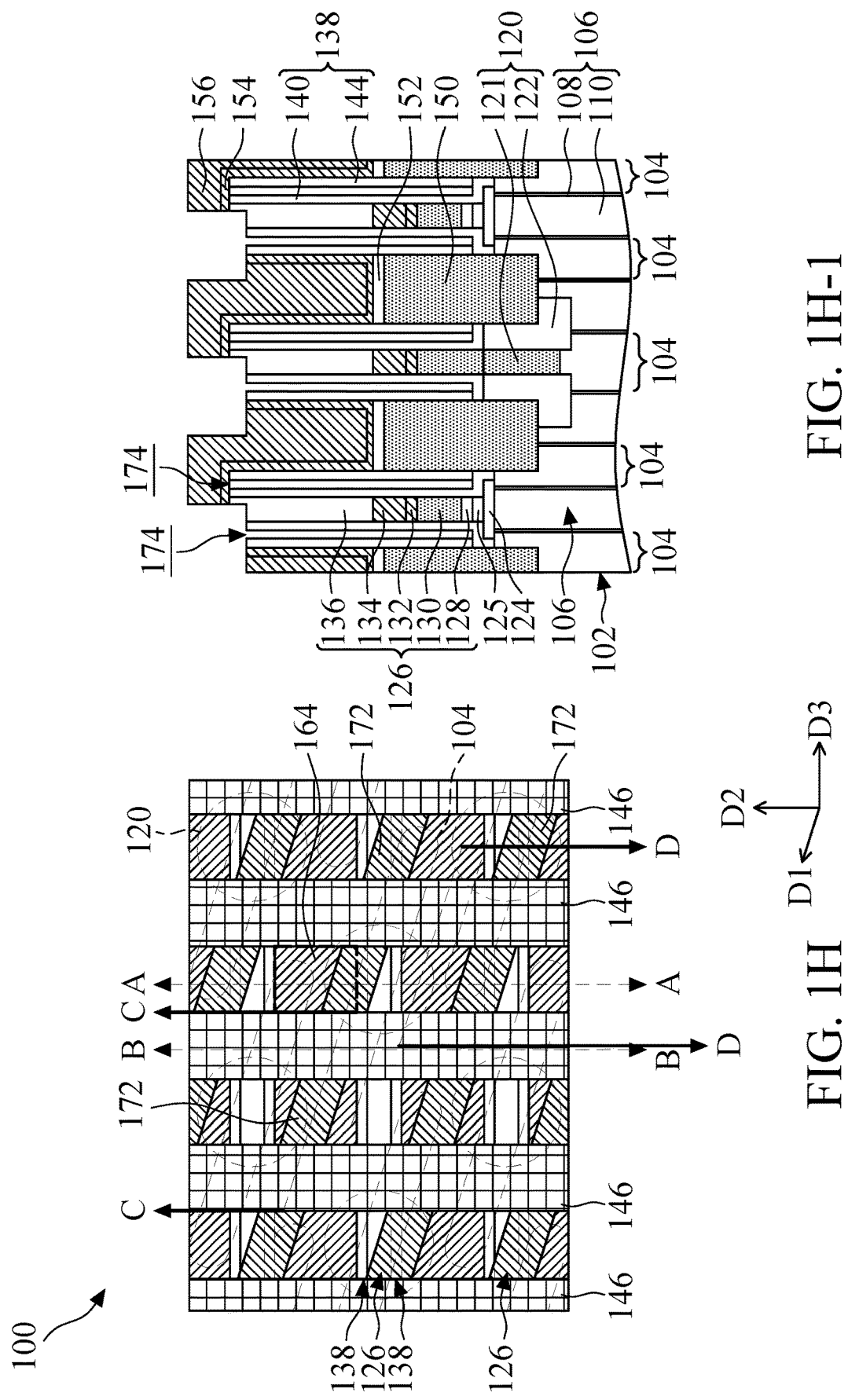

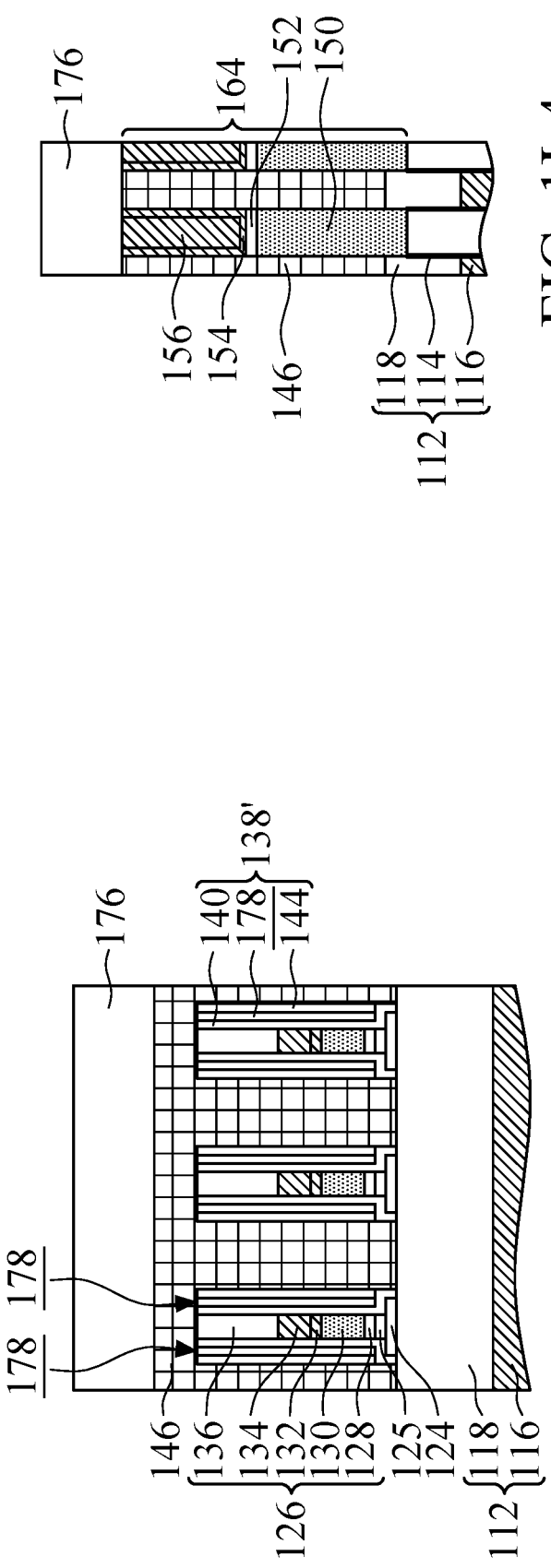
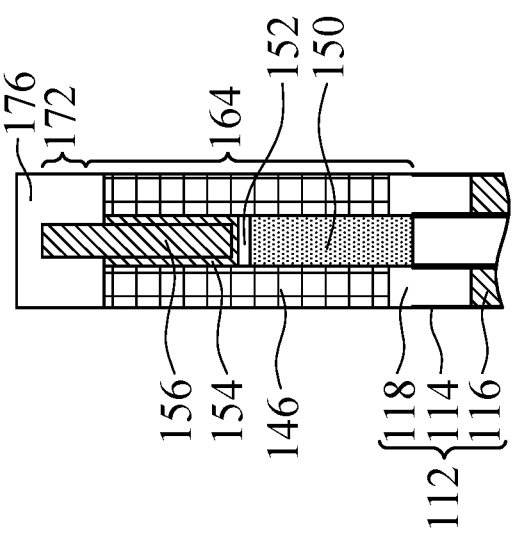
FIG. 1I-2
FIG. 1I-3
FIG. 1I-4

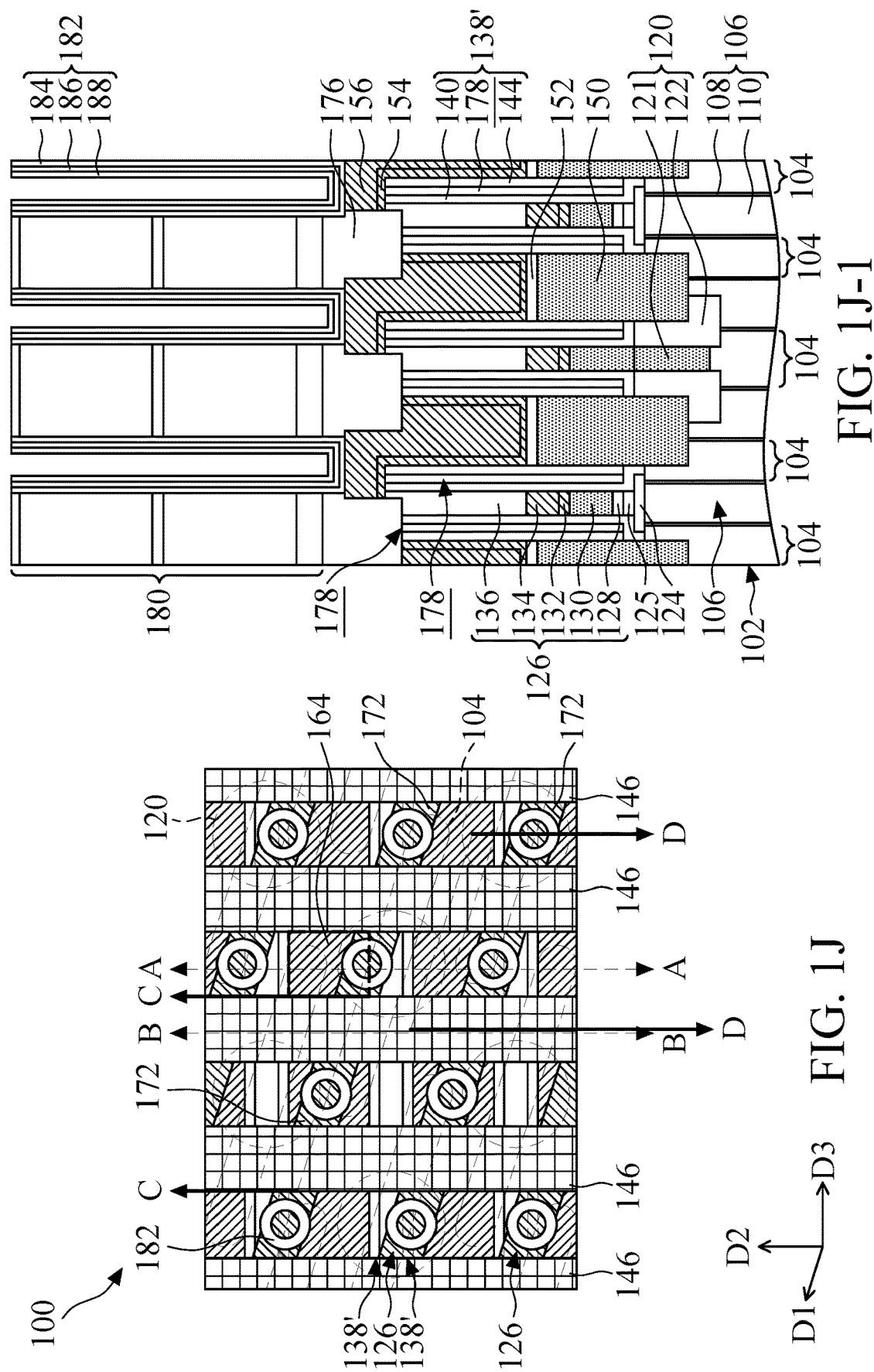

SEMICONDUCTOR MEMORY STRUCTURE AND METHOD FOR FORMING THE SAME

BACKGROUND

Field of the Disclosure

The present disclosure relates to a method for forming a semiconductor memory structure, and in particular, it relates to Dynamic Random Access Memory.

Description of the Related Art

In order to increase DRAM density and improve its performances, existing technologies for fabricating DRAM devices continue focusing on scaling down the DRAM size.

SUMMARY

The method of forming a semiconductor memory structure includes forming a plurality of conductive wire structures over a semiconductor substrate, and forming a plurality of spacer structures along sidewalls of the conductive wire structures. Each of the spacer structures includes a first spacer. The method also includes forming a plurality of dielectric strips across the conductive wire structures, forming a plurality of conductive strips over the conductive wire structures and the dielectric strips, performing a patterning process on the conductive strips to form a plurality of conductive pads, and removing the first spacer of each of the spacer structures to form a gap in each of the spacer structures.

In some embodiments of the disclosure, a method for forming a semiconductor memory structure is provided. The method includes forming a plurality of conductive wire structures over a semiconductor substrate, forming a plurality of spacer structures along sidewalls of the conductive wire structures, depositing multiple conductive materials between the conductive wire structures and over the conductive wire structures, patterning the multiple conductive materials to form a plurality of conductive strips over top surfaces of the conductive wire structures and top surfaces of the spacer structures, depositing a fill layer between the conductive strips, cutting the conductive strips, and performing an etching process to remove the fill layer and form a plurality of gaps in the spacer structures.

The semiconductor memory structure includes a first conductive wire structure and a second conductive wire structure disposed over a semiconductor substrate, a first spacer structure immediately adjacent to a first side of the first conductive wire structure, and a second spacer structure immediately adjacent to a second side of the second conductive wire structure. Each of the first spacer structure and the second spacer structure comprises an air gap. The semiconductor memory structure also includes a first dielectric strip and a second dielectric strip extending across the first conductive wire structure and the second conductive wire structure, a first contact plug disposed in a space defined by the first conductive wire structure, the second conductive wire structure, the first dielectric strip and the second dielectric strip, and a first conductive pad disposed over the first contact plug. The first conductive pad partially covers both the first spacer structure and the second spacer structure.

BRIEF DESCRIPTION OF THE DRAWINGS

In accordance with some embodiments of the present disclosure, it can be further understood by reading the subsequent detailed description and examples with references made to the accompanying drawings, wherein:

FIGS. 1A through 1J illustrate plan views of forming a semiconductor memory structure at various stages.

FIGS. 1A-1 through 1J-1, FIGS. 1A-2 through 1J-2 and FIG. 1A-3 through 1J-3 illustrate cross-sectional views of forming a semiconductor memory structure at various stages.

FIGS. 1C-4 through 1J-4 illustrate cross-sectional views of forming a semiconductor memory structure at various stages.

FIG. 2 and FIG. 3 illustrate plan views of semiconductor memory structures.

FIG. 2-1 and FIG. 3-1 illustrate cross-sectional views of semiconductor memory structures.

DETAILED DESCRIPTION

The present disclosure is described in detail with reference to the figures of the embodiments, can be embodied in a wide variety of implements and is not limited to embodiments described in the disclosure. The thickness of the layers and regions in the figures may be enlarged for clarity, and the same or similar reference numbers in the figures are denoted as the same or similar elements.

FIGS. 1A through 1J-4 illustrate schematic diagrammatic views of forming a semiconductor memory structure 100 at various stages. For ease of illustration, FIGS. 1A through 1J illustrate reference directions, in that a first direction D1 is a channel extending direction, a second direction D2 is a gate extending direction (or a word-line extending direction), and a third direction D3 is a bit-line extending direction. The first direction D1 is not perpendicular to the second direction D2. The second direction D2 is substantially perpendicular to the third direction D3.

FIGS. 1A through 1J further illustrate reference cross-sections, in that cross-section A-A is a plane that is parallel with the gate extending direction (i.e., the second direction D2) and passes through between adjacent gate structures, cross-section B-B is a plane that is parallel with and passes through the gate extending direction, cross-section C-C is a plane that is parallel with the channel extending direction (i.e., the first direction D1) and passes through conductive strips (shown in FIG. 1C), cross-section D-D is a plane that is parallel with the channel extending direction and passes through between adjacent conductive strips.

Figures 1, 1A, 2, 3:
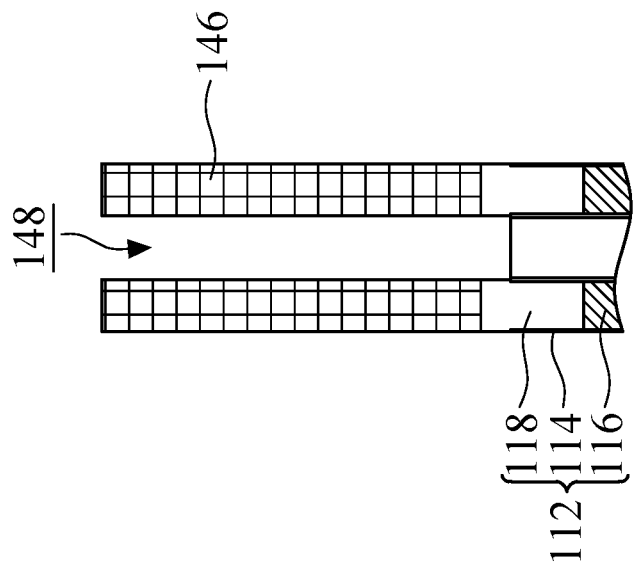
Figures 1, 1A, 2:
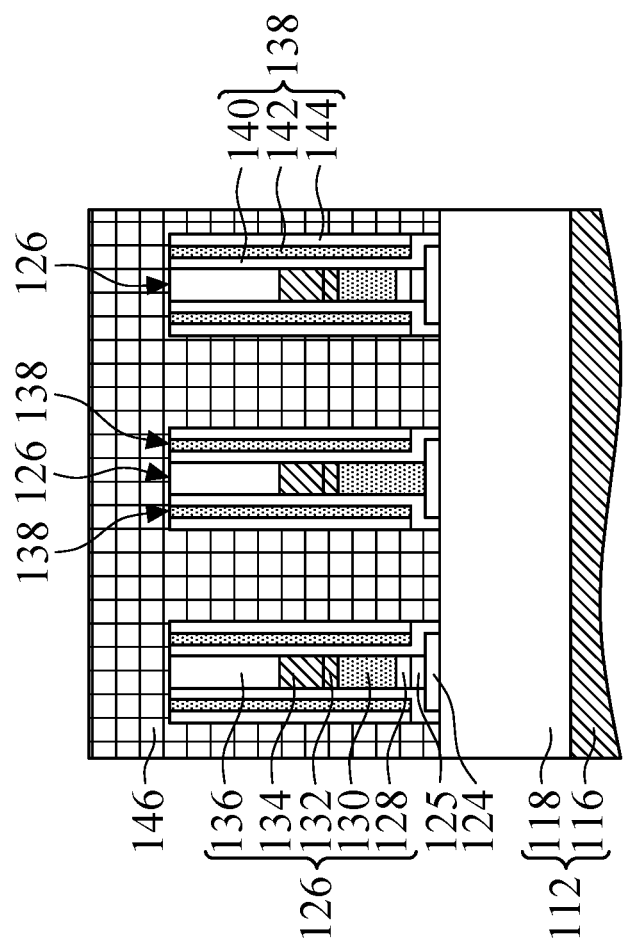
Figures 1, 1B:
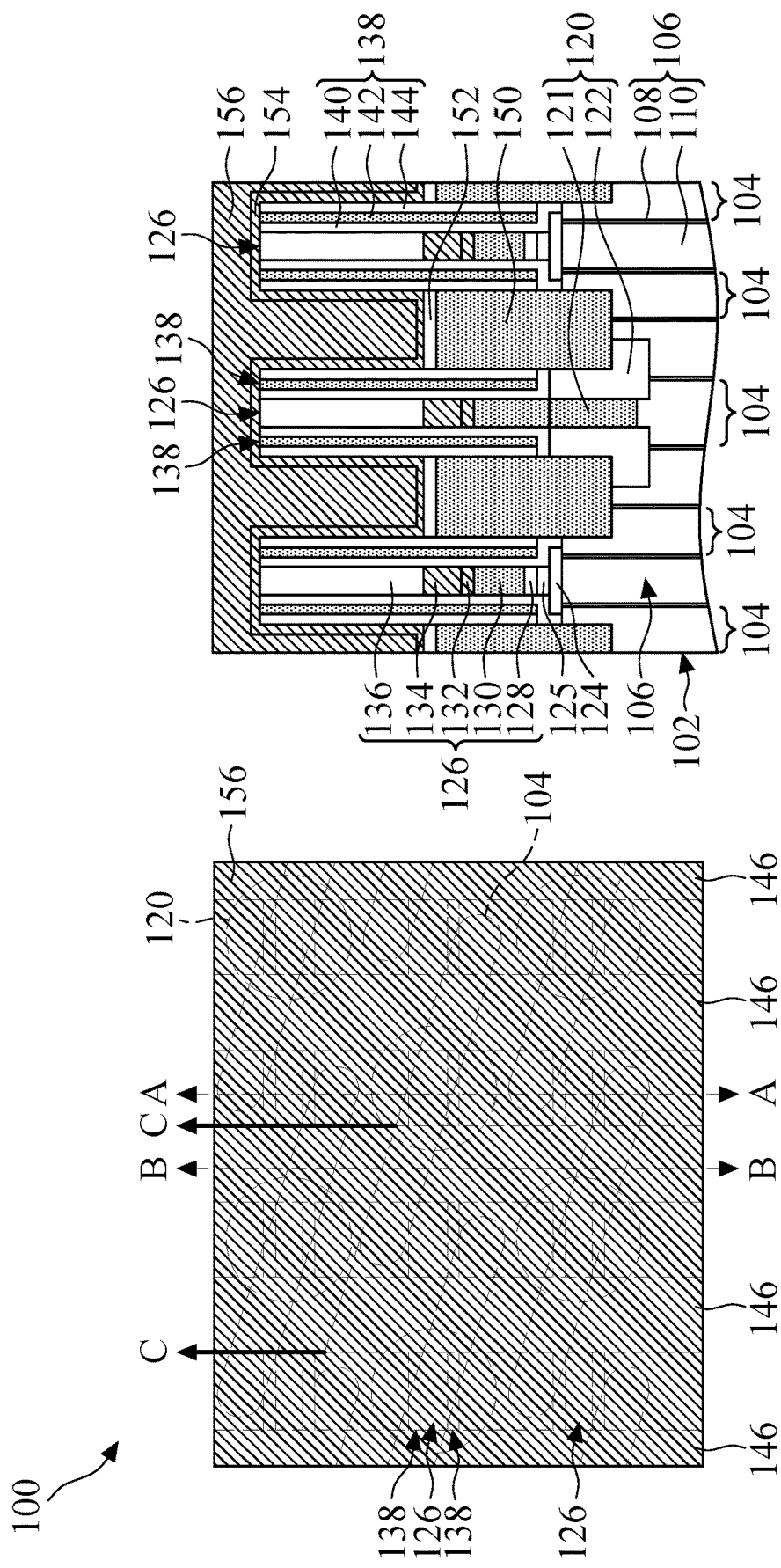
Figures 1, 1B, 2, 3:
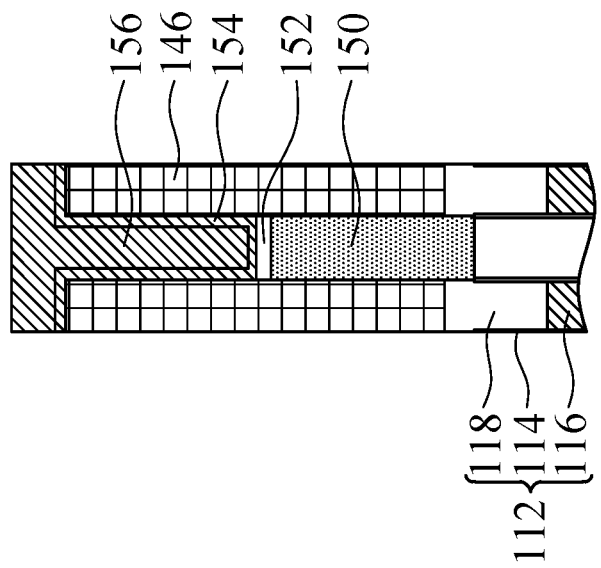
Figures 1, 1B, 2:
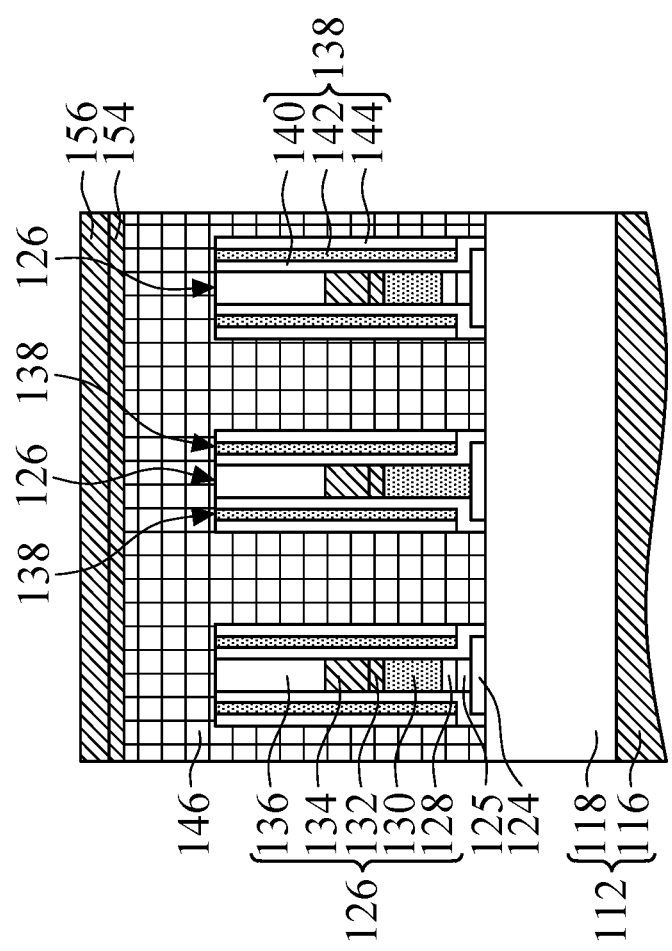
Figures 1, 1C:
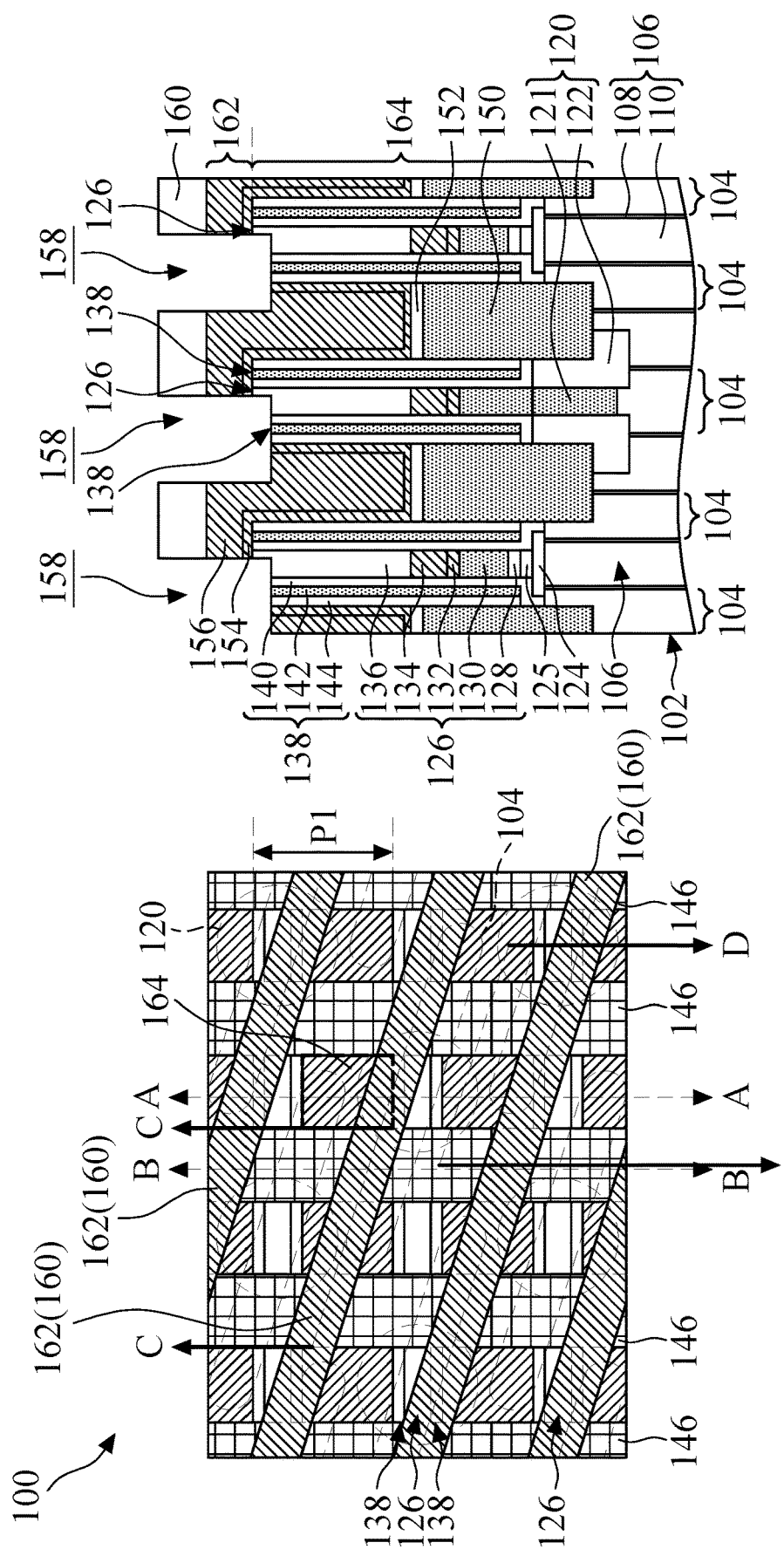
Figures 1, 1D:
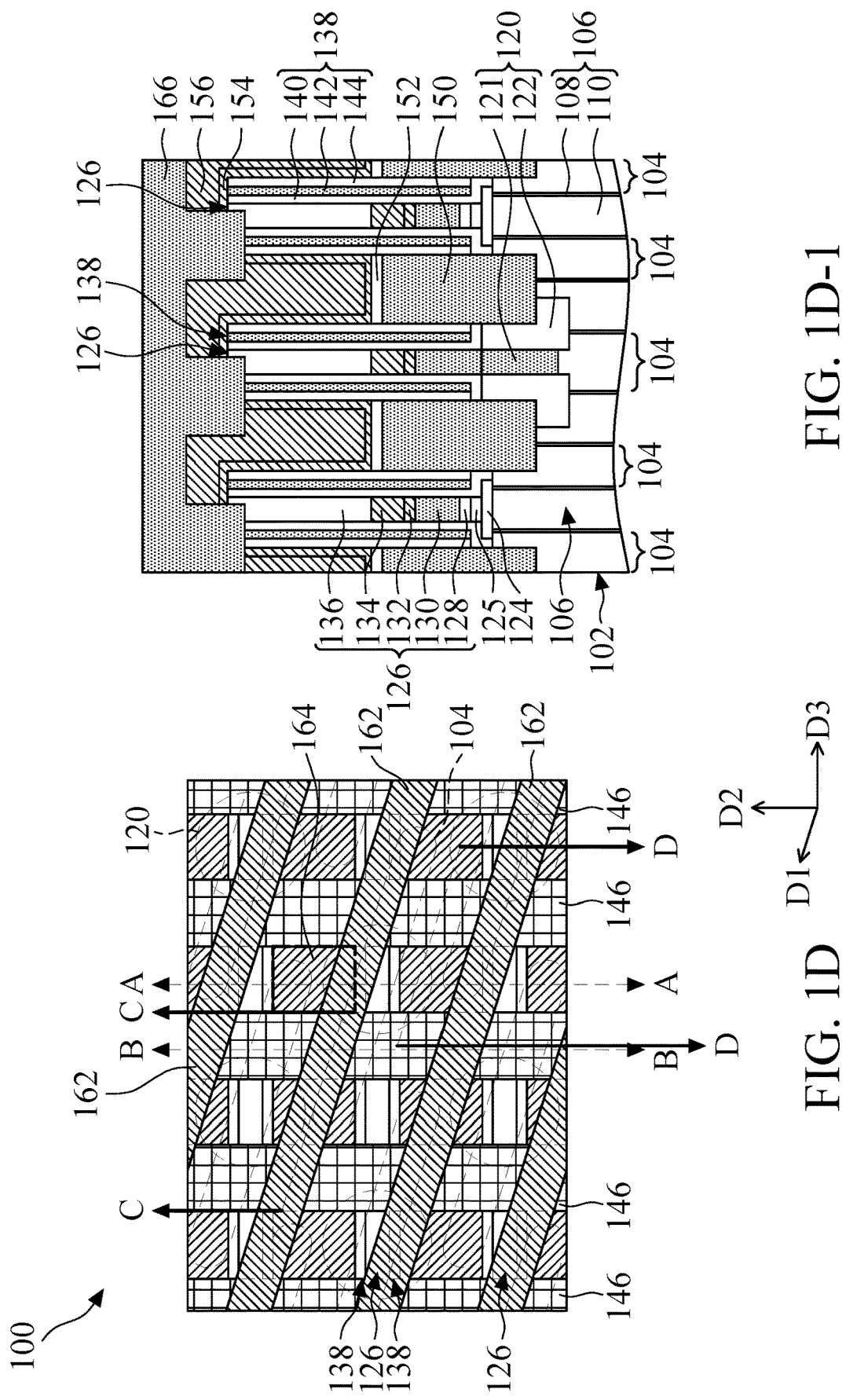
Figures 1, 1D, 2, 3, 4:
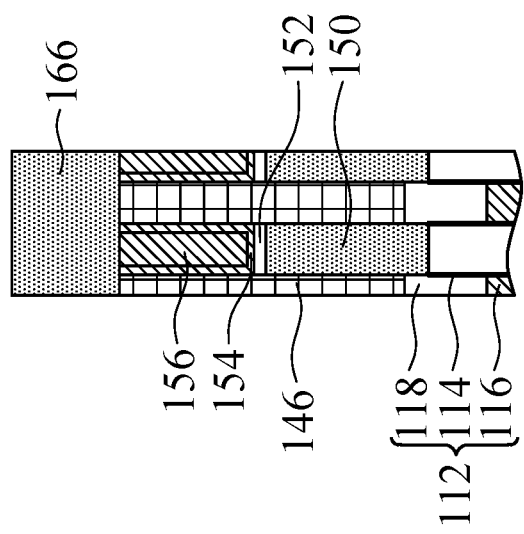
Figures 1, 1D, 2, 3:
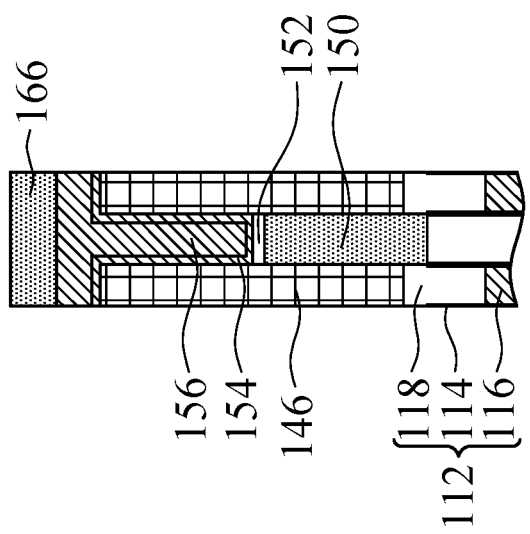
Figures 1, 1D, 2:
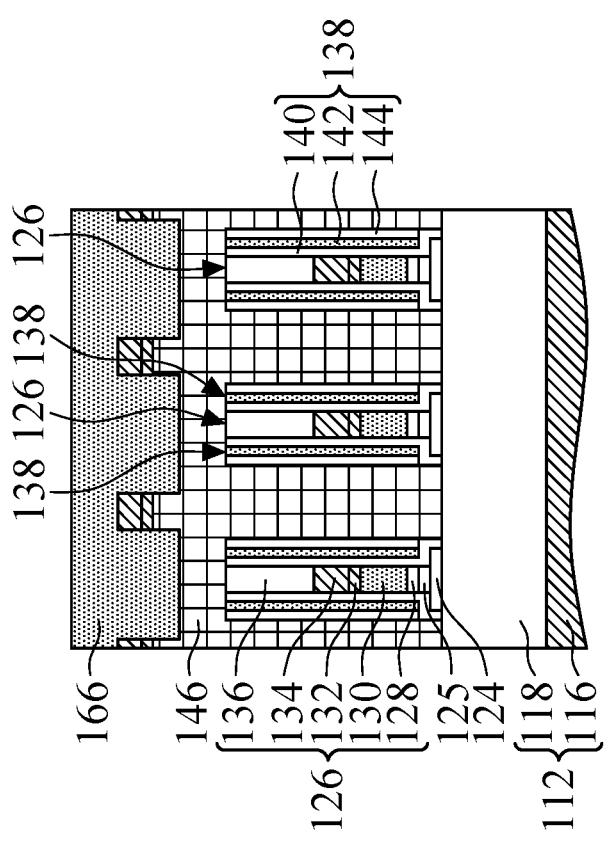
Figures 1, 1F:
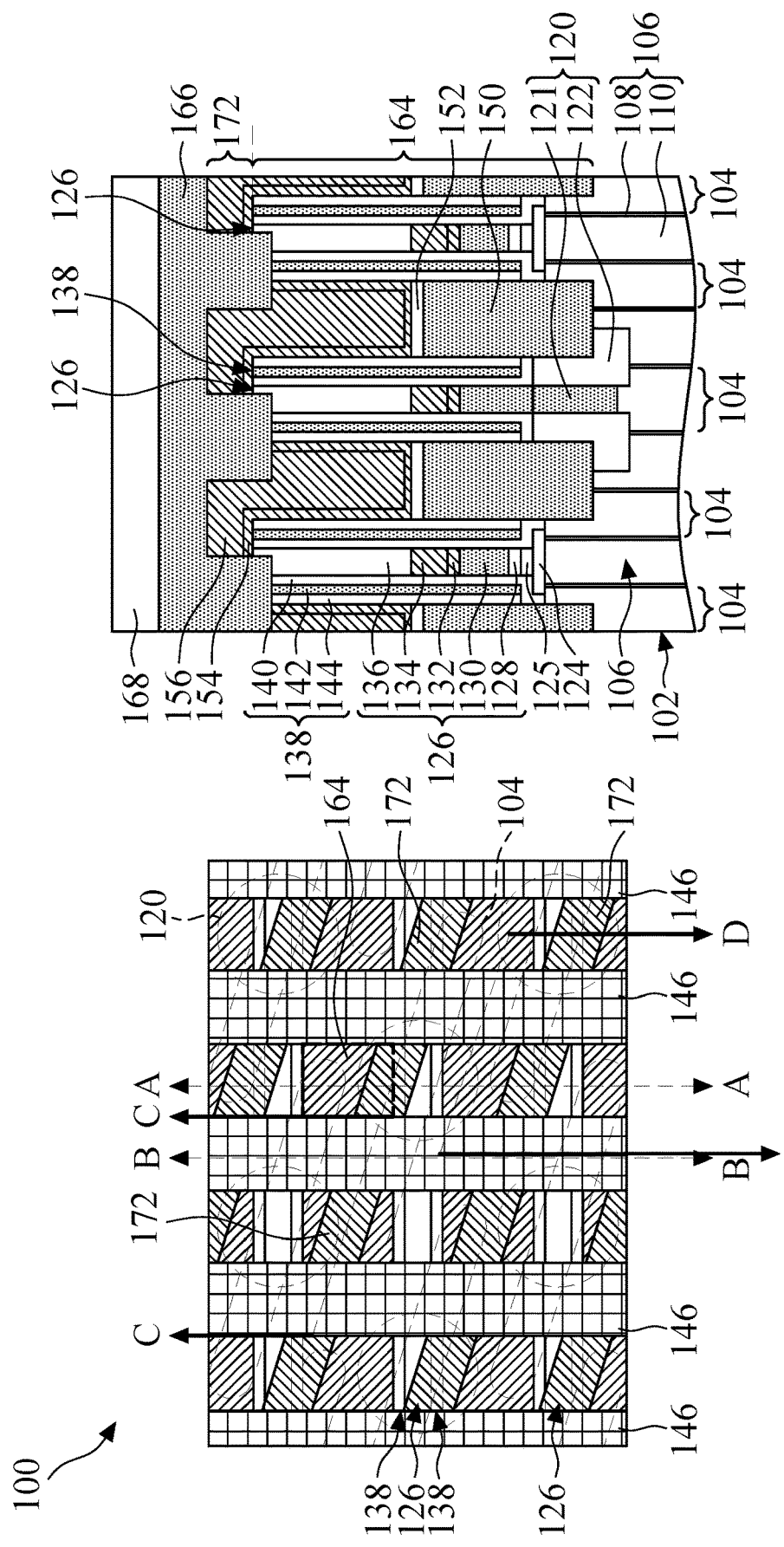
Figures 1, 1G:
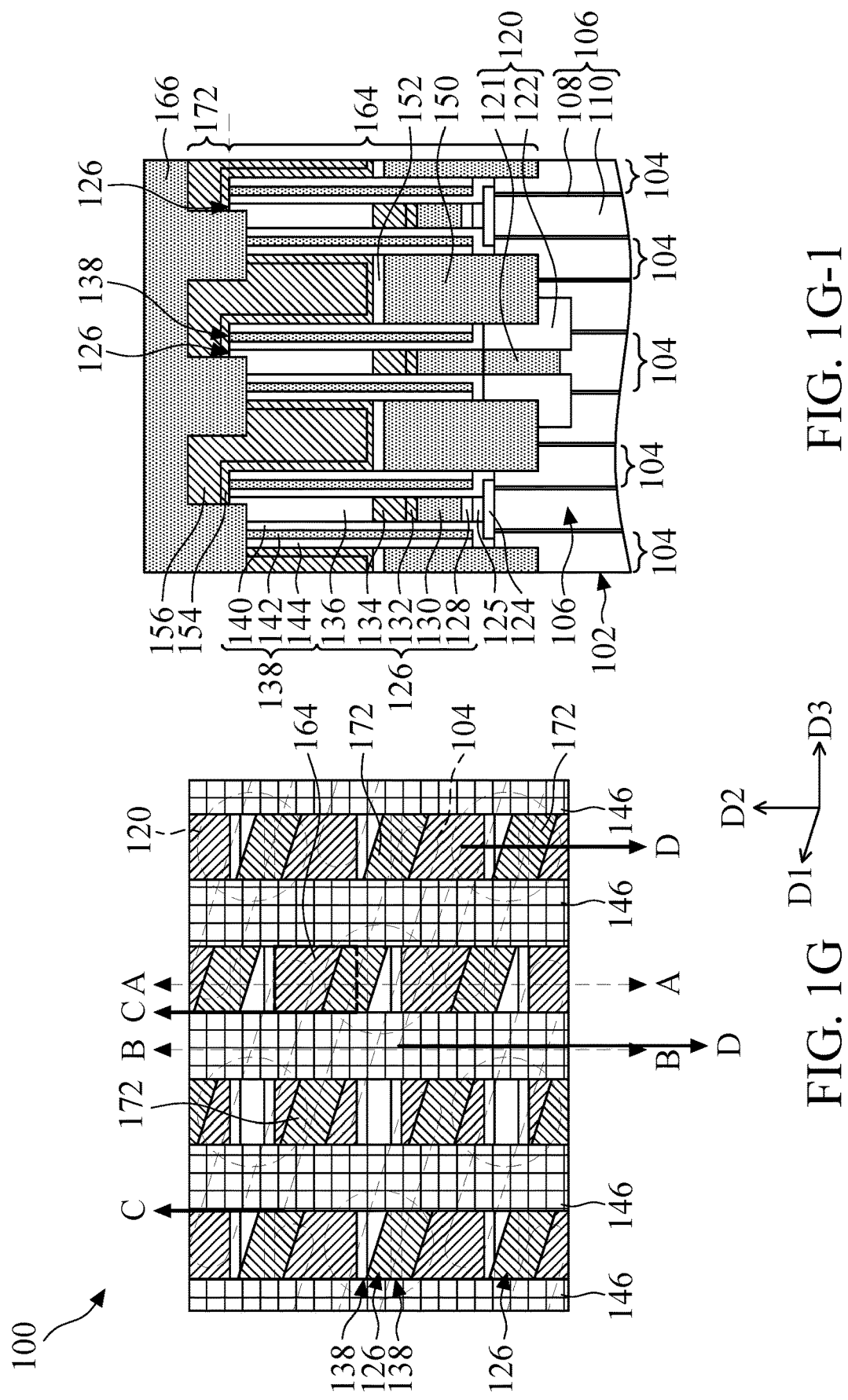
Figures 1, 1G, 2, 3, 4:
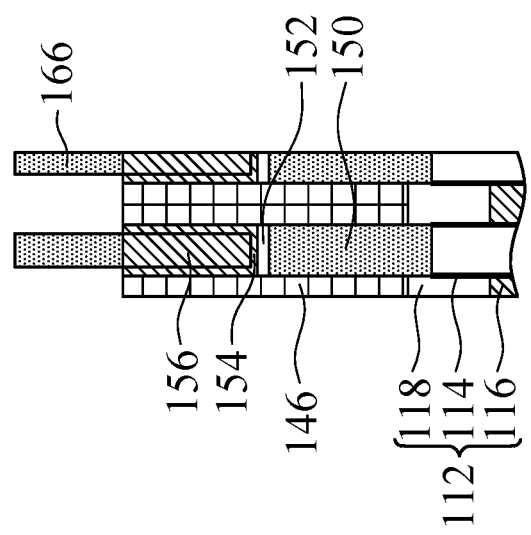
Figures 1, 1G, 2, 3:
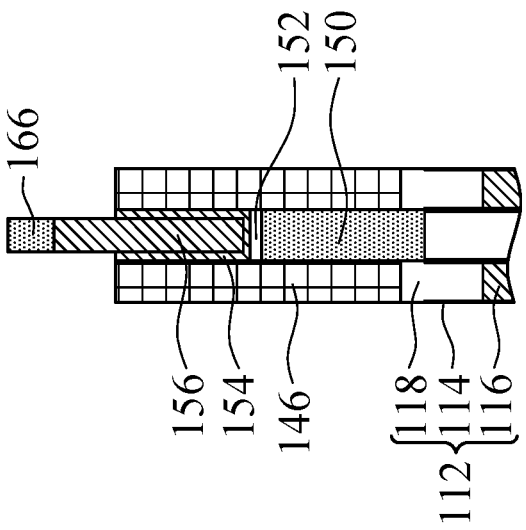
Figures 1, 1G, 2:
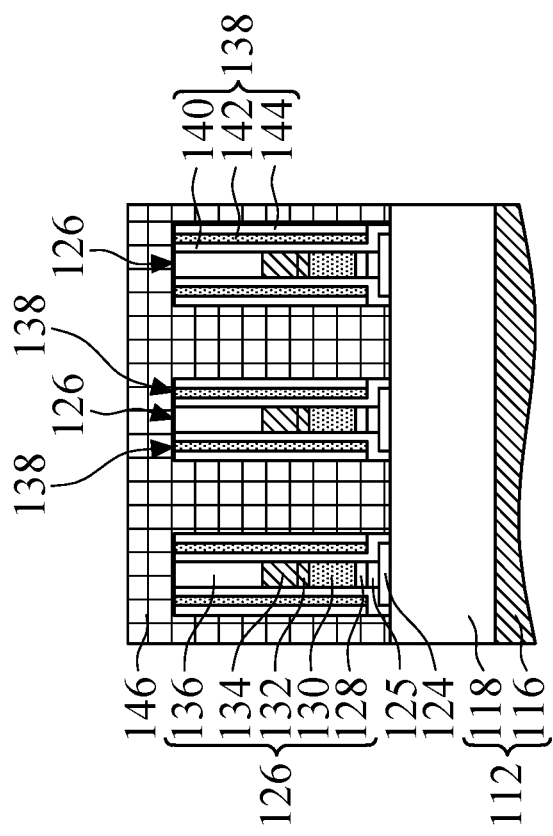
Figures 1, 1H, 2, 3, 4:
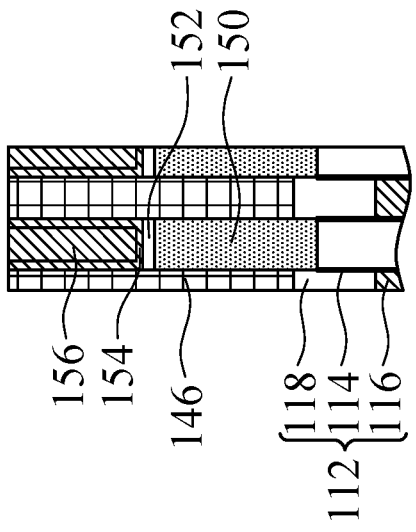
Figures 1, 1H, 2, 3:
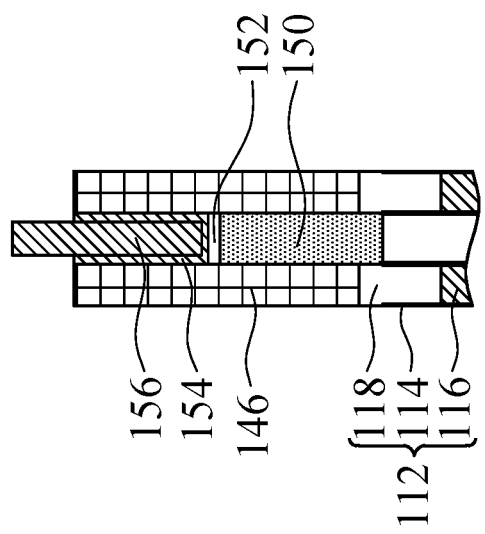
Figures 1, 1H, 2:
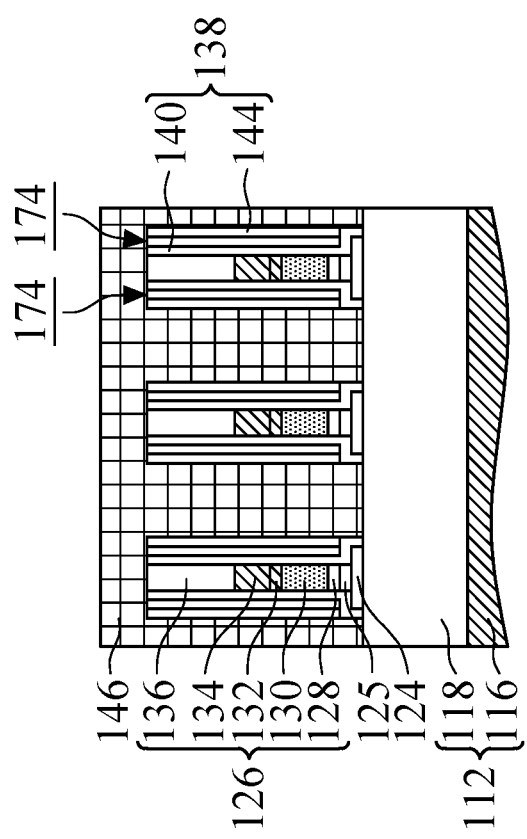
Figures 1, 1I:
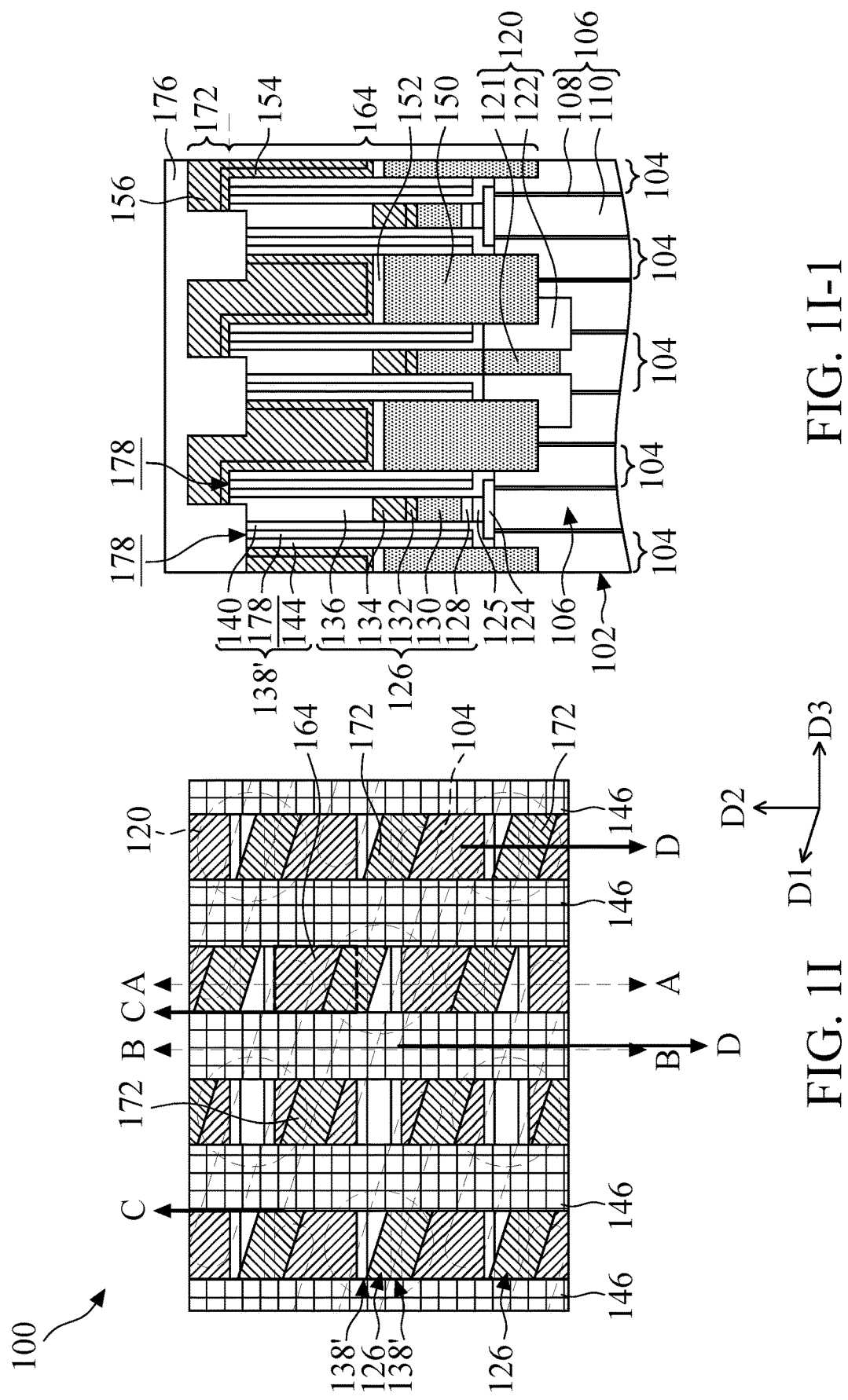
Figures 1, 1J, 2, 3:
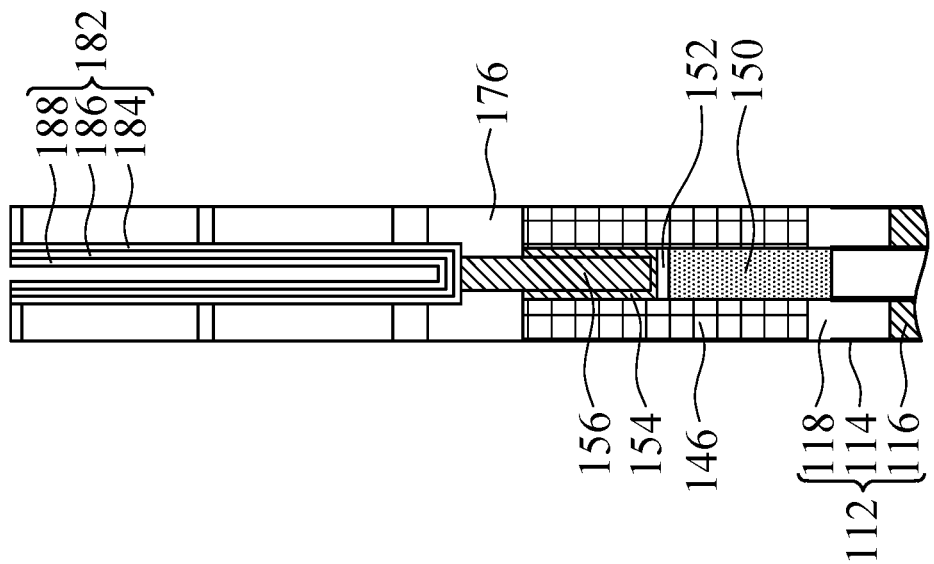
Figures 1, 1J, 2:
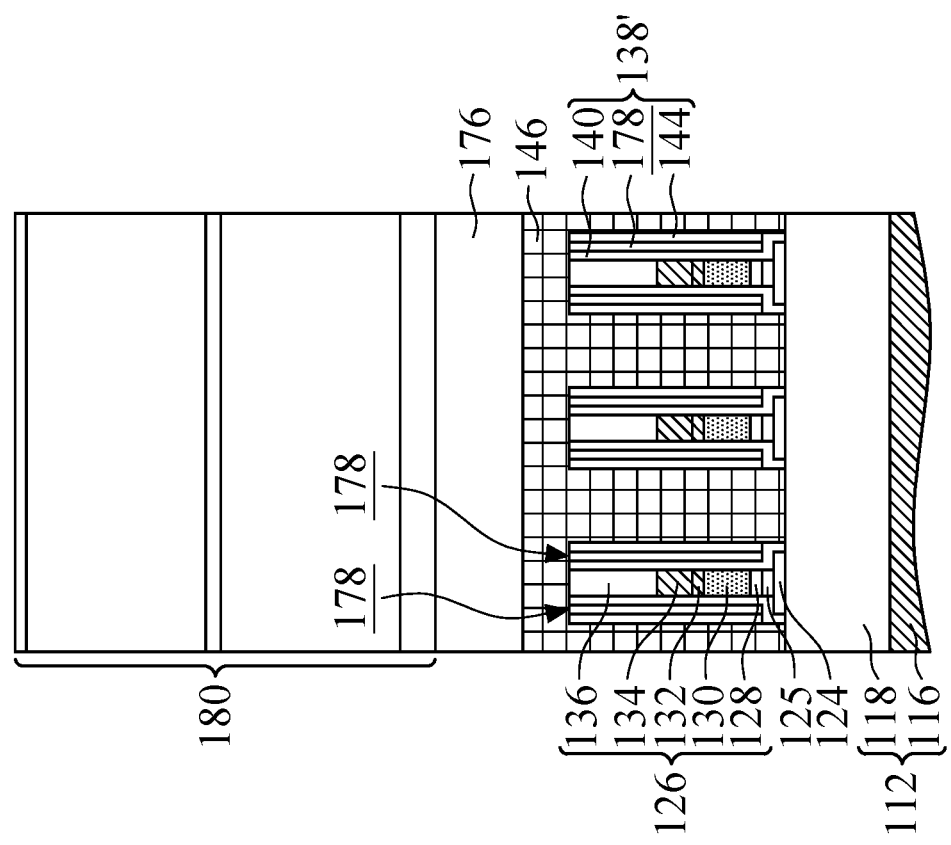
Figures 1, 1J, 2, 3, 4:
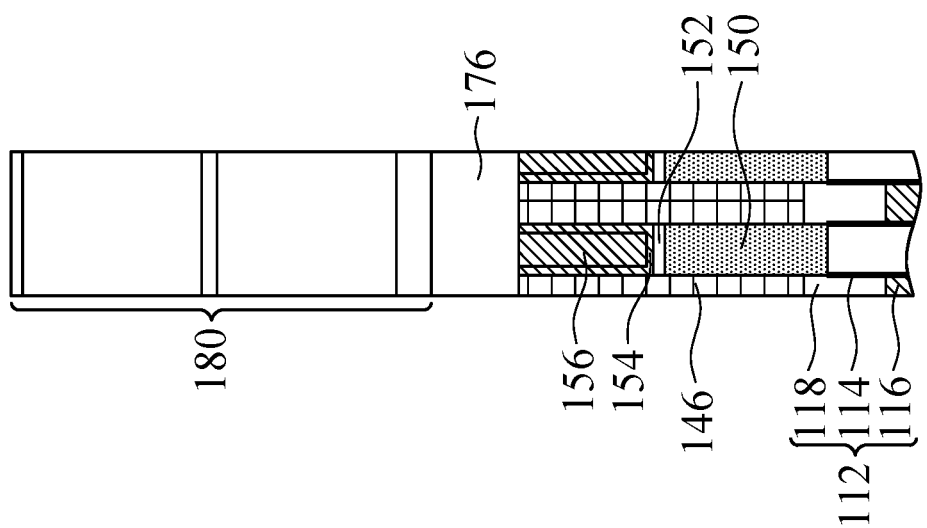
Figures 1, 2:
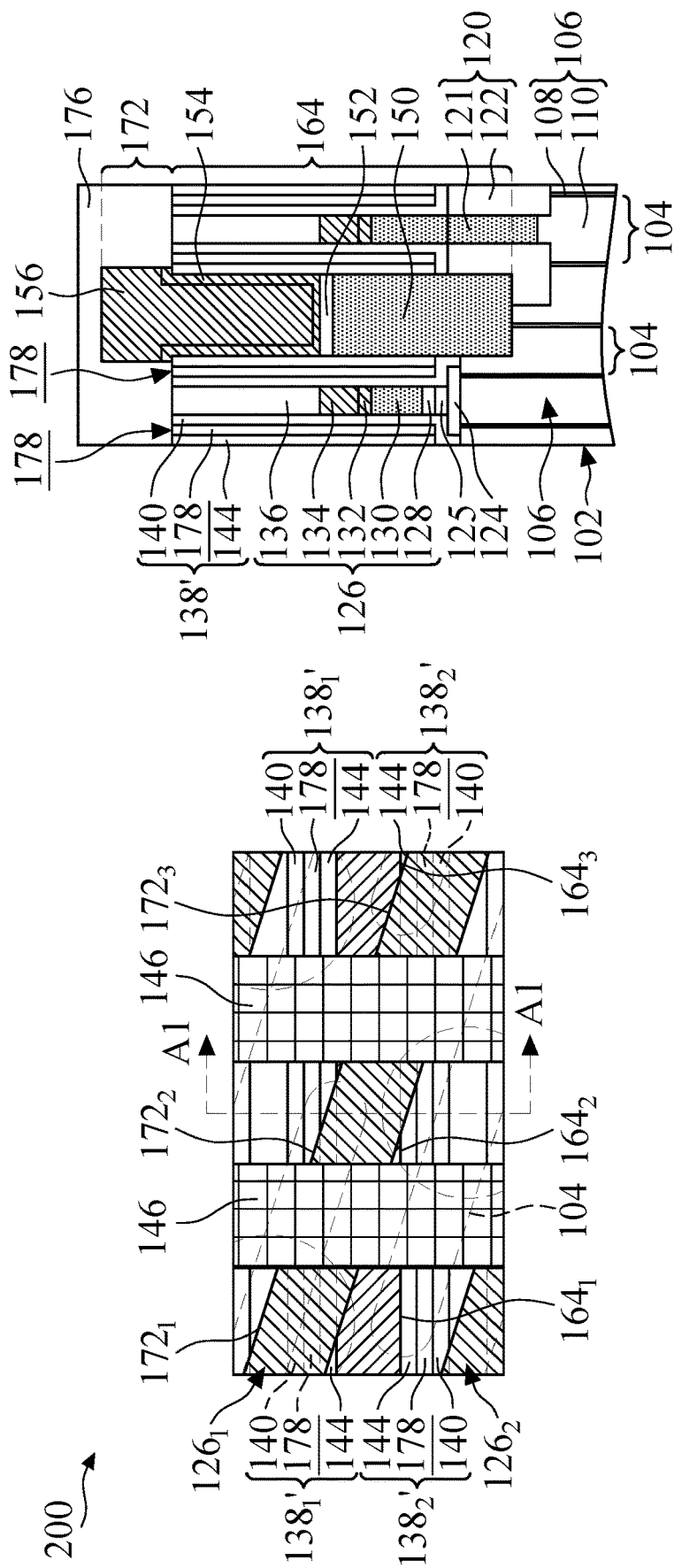
Figures 1, 3:
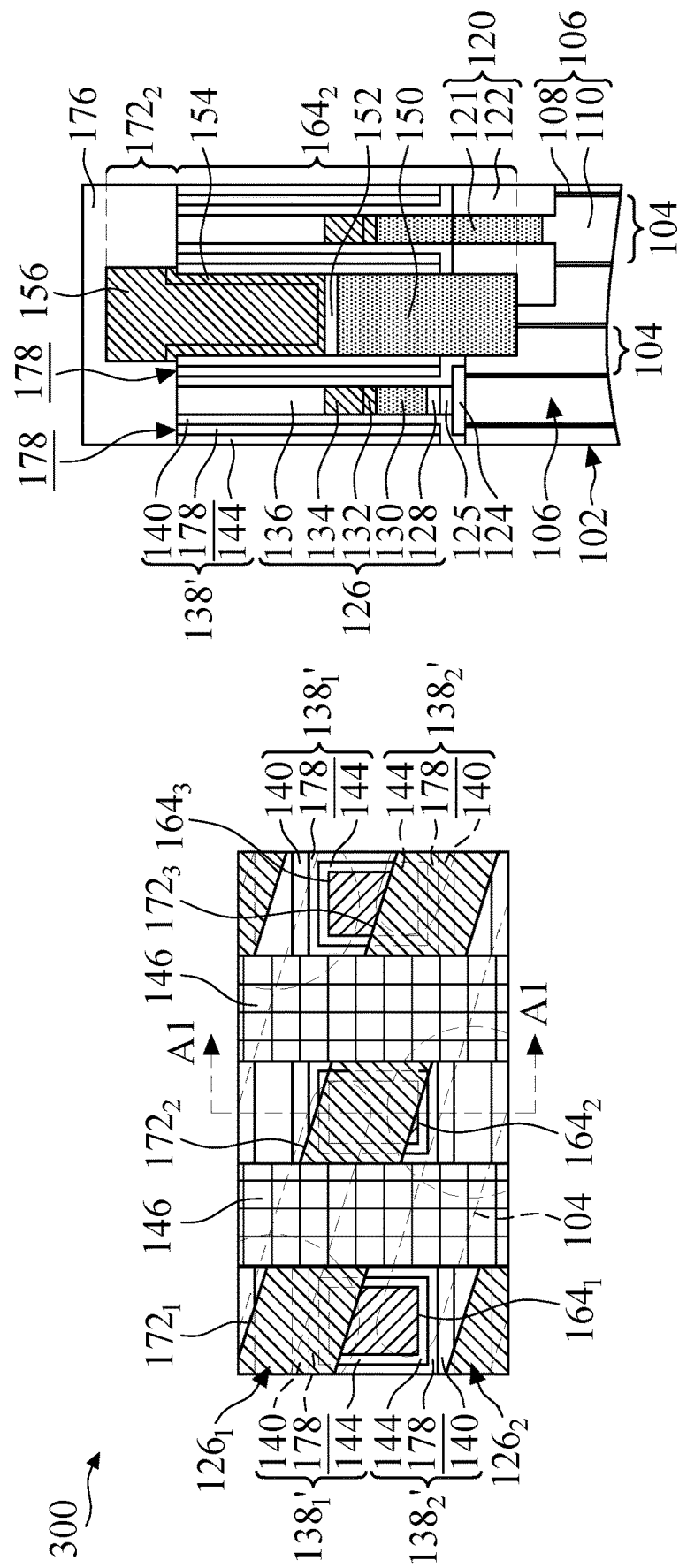

FIGS. 1A-1 through 1J-1 illustrate cross-sectional views of the semiconductor memory structure 100 taken along cross-section A-A shown in FIGS. 1A through 1J. FIGS. 1A-2 through 1J-2 illustrate cross-sectional views of the semiconductor memory structure 100 taken along cross-section B-B shown in FIGS. 1A through 1J. FIGS. 1A-3 through 1J-3 illustrate cross-sectional views of the semiconductor memory structure 100 taken along cross-section C-C shown in FIGS. 1A through 1J. FIGS. 1C-4 through 1J-4 illustrate cross-sectional views of the semiconductor memory structure 100 taken along cross-section D-D shown in FIGS. 1C through 1J.

As shown in FIGS. 1A, 1A-1, 1A-2 and 1A-3, the semiconductor memory structure 100 includes a semiconductor substrate 102, an isolation structure 106, gate structures 112, conductive wire contact structures 120, conductive wire structures 126, spacer structures 138 and dielectric strips 146. For the sake of clarity, some features are not shown in FIG. 1A, but can be seen in FIGS. 1A-1, 1A-2, and 1A-3.

The semiconductor substrate 102 includes active regions 104, isolation regions and chop regions. The active regions 104 are semiconductor blocks that extend in the first direction D1. The isolation regions extend in the first direction D1, thereby dividing the semiconductor substrate 102 into multiple semiconductor strips (not shown). The chop regions are disposed corresponding to the semiconductor strips and cut the semiconductor strips into multiple active regions 104. As a result, each of the active regions 104 is defined by two isolation regions and two chop regions. Neighboring chop regions arranged in the second direction D2 may be staggered, or they do not overlap one another.

An isolation structure 106 is formed in the isolation regions and the chop regions. The isolation structure 106 extends a distance downward from the upper surface of the semiconductor substrate 102 and surrounds and electrically isolates the active regions 104. The isolation structure 106 includes a lining layer 108 and an insulating material 110. The lining layer 108 lines between the insulating material 110 and the active regions 104. The lining layer 108 may be made of dielectric material such as silicon oxide (SiO), silicon nitride (SiN), silicon oxynitride (SiON), and/or a combination thereof. The insulating material 110 may be made of dielectric material such as silicon oxide (SiO), silicon nitride (SiN), silicon oxynitride (SiON), and/or a combination thereof.

Gate structures are formed in the semiconductor substrate 102. The gate structures 112 extend in the second direction D2 and are arranged in parallel in the third direction D3. The gate structures 112 are configured as the word lines of the resulting semiconductor memory device and also referred to as buried word lines (BWL). The gate structures 112 extend alternatingly through the active regions 104 and the isolation structure 106. Two gate structures 112 extend through a single active region 104, and two gate structures 112 extend through chop regions which are on the opposite sides of this active region 104. The gate structure 112 includes a gate dielectric layer 114, a gate electrode layer 116, and a capping layer 118. The gate dielectric layer 114 lines between the gate electrode layer 116 and the active regions 104 (or the isolation structure 106) and lines between the capping layer 118 and the active regions 104 (or the isolation structure 106).

In some embodiments, the gate dielectric layer 114 is made of silicon oxide (SiO), silicon nitride (SiN), silicon oxynitride (SiON), high-k dielectric material, and/or a combination thereof. In some embodiments, the gate electrode layer 116 is made of conductive material such as semiconductor material (such as polysilicon), metal material (such as tungsten (W), aluminum (Al), copper (Cu), cobalt (Co), or ruthenium (Ru)), or metal nitride (such as titanium nitride (TiN) or tantalum nitride (TaN)), and/or a combination thereof. In some embodiments, the capping layer 118 is made of dielectric material such as silicon nitride (SiN), silicon oxynitride (SiON), silicon oxide (SiO), and/or a combination thereof.

Conductive wire contact structures 120 are formed over the active regions 104. The conductive wire contact structures 120 include contact plugs 121 and spacers 122 surrounding the contact plugs 121. The contact plugs 121 correspond to and contact center portions of the active regions 104. The center portions of the active regions 104 are source regions or drain regions between adjacent gate structures 112. The spacer 122 may be configured to separate subsequently formed contact plugs from the contact plugs 121 and separate the subsequently formed contact plugs from the center portions of the active regions 104.

In some embodiments, the contact plugs 121 are made of conductive material such as semiconductor material (such as polysilicon), metal material (such as tungsten (W), aluminum (Al), copper (Cu), cobalt (Co), or ruthenium (Ru)), or metal nitride (such as titanium nitride (TiN) or tantalum nitride (TaN)), and/or a combination thereof. In some embodiments, the spacers 122 are made of dielectric material such as silicon nitride (SiN), silicon oxynitride (SiON), silicon oxide (SiO), and/or a combination thereof.

Conductive wire structures 126 are formed over the semiconductor substrate 102. The conductive wire structures 126 extend in the third direction D3 and are arranged in parallel in the second direction D2. The conductive wire structures 126 are configured as bit lines of the resulting semiconductor memory device. The conductive wire structures 126 include insulating layers 128, first conductive layers 130 over the insulating layers 128, second conductive layers 132 over the first conductive layers 130, third conductive layers 134 over the second conductive layers 132, and capping layers 136 over the third conductive layers 136.

In some embodiments, the insulating layers 128 are made of dielectric material such as silicon nitride (SiN), silicon oxynitride (SiON), silicon oxide (SiO), and/or a combination thereof. In some embodiments, the first conductive layers 130 are made of polysilicon, the second conductive layers 132 are made of barrier material such as metal nitride such as titanium nitride (TiN) or tantalum nitride (TaN). Metal silicide may be formed between the first conductive layer 130 and the second conductive layer 132. In some embodiments, the third conductive layers 134 are made of metal material such as tungsten (W), aluminum (Al), copper (Cu), cobalt (Co), or ruthenium (Ru). In some embodiments, the capping layers 136 are made of dielectric material such as silicon nitride (SiN), silicon oxynitride (SiON), silicon oxide (SiO), and/or a combination thereof.

The conductive wire structures 126 are electrically connected to the center portions of the active regions 104 through the contact plugs 121 of the conductive wire contact structures 120. For example, portions of the insulating layers 128 directly above the contact plugs 121 are removed such that the first conductive layers 130 of the conductive wire structures 126 are in contact with the contact plugs 121. In addition, insulating layers 124 and 125 may be formed between the conductive wire structures 126 and the semiconductor substrate 102 (or the isolation structure 106 or the gate structures 112) such that the conductive material of the conductive wire structures 126 may be far away from some other conductive features of the semiconductor memory structure 100. In some embodiments, the insulating layers 124 and 125 are made of silicon oxide (SiO), silicon nitride (SiN), silicon oxynitride (SiON), and/or a combination thereof.

Spacer structures 138 are formed along the opposite sidewalls of the conductive wire structures 126. The spacer structures 138 are configured to separate following formed contact plugs and the conductive wire structures 126. The spacer structures 138 include spacers 140, spacers 142 along the sidewalls of the spacers 140, and spacers 144 along the sidewalls of the spacers 142. In some embodiments, the spacers 140, 142 and 144 are made of dielectric material such as silicon oxide (SiO), silicon nitride (SiN), silicon oxynitride (SiON), and/or a combination thereof. In some embodiments, the spacers 140 and the spacers 144 are made of the same material. The spacers 142 are made of a different material than the spacers 140 and the spacers 144. For example, the spacers 140 and the spacers 144 are made of silicon nitride, and the spacers 142 are made of silicon oxide.

Dielectric strips 146 are formed over the semiconductor substrate 102. The dielectric strips 146 extend in the second direction D2 and are arranged in parallel in the third direction D3. The dielectric strips 146 correspond to and cover the gate structures 112. The dielectric strips 146 extend across the conductive wire structures 126 and the spacer structures 138. The top surfaces of the portions of the conductive wire structures 126 and the spacer structures 138 covered by the dielectric strips 146 are located at a lower level than the top surfaces of the portions of the conductive wire structures 126 and the spacer structures 138 exposed from the dielectric strips 146. In some embodiments, the dielectric strips 146 are made of dielectric material such as silicon nitride (SiN), silicon oxynitride (SiON), silicon oxide (SiO), and/or a combination thereof.

Openings 148 are defined by adjacent dielectric strips 146 and adjacent conductive wire structures 126. End portions of the active regions 104 are exposed from the openings 148. The end portions of the active regions 104 are source regions or drain regions which are located outside the adjacent gate structures 112.

Multiple conductive materials 150, 152, 154 and 156 are sequentially formed over the semiconductor substrate 102, as shown in FIGS. 1B, 1B-1, 1B-2 and 1B-3. The conductive material 150 fills lower portions of the openings 148. The conductive material 152 is formed over the upper surface of the conductive material 150. The conductive material 154 is formed along the upper surface of the conductive material 152, and the sidewalls of upper portions of the openings 148. The conductive material 154 is further formed along the top surfaces of the spacer structures 138, the top surfaces of the conductive wire structures 126 and the top surfaces of the dielectric strips 146. The conductive material 156 is formed over the conductive material 154 and overfills the upper portions of the openings 148.

In some embodiments, the conductive material 150 is a semiconductor layer, for example, made of polysilicon. In some embodiments, the conductive material 152 is made of metal silicide such as cobalt silicide (CoSi), nickel silicide (NiSi), titanium silicide (TiSi) or tungsten silicide (WSi). In some embodiments, the conductive material 154 is a barrier layer, for example, made of metal nitride (such as titanium nitride (TiN), tantalum nitride (TaN) or tungsten nitride (WN)). In some embodiments, the conductive material 156 is a metal layer, for example, made of tungsten (W), aluminum (Al), copper (Cu), titanium (Ti), or tantalum (Ta).

A first patterning process is performed on the conductive materials 154 and 156 to form multiple conductive strips 162, as shown in FIGS. 1C, 1C-1, 1C-2, 1C-3 and 1C-4. The first patterning process includes forming patterned mask layers 160 over the conductive material 156. The patterned mask layers 160 are patterned photoresist layers formed by a photolithography process or patterned hard mask layers formed by depositing a dielectric material followed by photolithography and etching processes.

The first patterning process also includes recessing portions of the conductive materials 154 and 156 uncovered by the patterned mask layers 160 using an etching process, thereby forming the conductive strips 162 and trenches 158 between the conductive strips 162. The etching process further recesses portions of the spacer structures 138, the conductive wire structures 126 and the dielectric strips 146 uncovered by the patterned mask layers 160.

The conductive strips 162 extend in the first direction D1 and are arranged in parallel in the second direction D2. The conductive strips 162 are located over the top surfaces of the conductive wire structures 126 and the top surfaces of the dielectric strips 146. The conductive strips 162 and the conductive wire structures 126 may have the same pitch P1 in the second direction D2.

Portions of the conductive materials 150, 152, 154 and 156 formed in the openings 148 (FIGS. 1A, 1A-1 and 1A-3) may be used as contact plugs 164 of the semiconductor memory structure 100. The contact plugs 164 correspond to and contact the end portions of the active regions 104. Each of the contact plugs 164 is at least partially covered by the conductive strips 162.

After forming the conductive strips 162, the patterned mask layers 160 are removed. Next, a fill layer 166 is formed over the semiconductor memory structure 100, as shown in FIGS. 1D-1, 1D-2, 1D-3 and 1D-4. The fill layer 166 is not illustrated in FIG. 1D for the sake of clarity. The fill layer 166 fills the trenches 158 and covers the conductive strips 162. The fill layer 166 may provide a planar upper surface for a following photolithography process. In some embodiments, the fill layer 166 is of the dielectric material such as silicon oxide (SiO), silicon nitride (SiN), silicon oxynitride (SiON), and/or a combination thereof. In some embodiments, the fill layer 166 and the spacers 142 are made of the same material such as silicon oxide. There is an interface between the fill layer 166 and the spacers 142 for the sake of clarity. However, there may be no interface therebetween.

A second patterning process is performed on the conductive materials 154 and 156. The second patterning process includes forming patterned mask layers 168 over the fill layer 166, as shown in FIGS. 1E, 1E-1, 1E-2, 1E-3 and 1E-4. The patterned mask layers 168 are patterned photoresist layers formed by a photolithography process or patterned hard mask layers formed by depositing a dielectric material followed by photolithography and etching processes. Alternatively, the patterned mask layers 168 are made of spin-on coating carbon. The patterned mask layers 168 extend in the second direction D2 and are arranged in parallel in the third direction D3. The patterned mask layers 168 are staggered (e.g., they do not overlap) with the dielectric strips 146 and cover the contact plugs 164. The patterned mask layers 168 may also not cover portions of the barrier layer 154 formed along the sidewalls of the dielectric structures 146. The patterned mask layers 168 and the dielectric strips 146 may have the same pitch P2 in the third direction D3.

The second patterning process also includes removing portions of the fill layer 166 uncovered by the patterned mask layers 168 using an etching process. The etching process further removes portions of the conductive strips 162 uncovered by the patterned mask layers 168 such that the conductive strips 162, including the conductive materials 154 and 156, are cut into multiple conductive pads 172, as shown in FIGS. 1F, 1F-1, 1F-2, 1F-3 and 1F-4. The fill layer 166 and the patterned mask layers 168 are not shown in FIG. 1F for the sake of clarity. The etching process also recesses portions of the dielectric strips 146 uncovered by the patterned mask layers 168 such that the etched conductive material 156 protrudes from between the dielectric strips 146. In addition, the etching process also recesses the conductive material 154 such that the etched conductive material 156 protrudes from the conductive material 154, as shown in FIG. 1F-3.

Each of the conductive pads 172 corresponds to and partially covers each of the contact plugs 164. Some of the conductive pads 172 partially cover both the conductive wire structures 126 and the spacer structures 138. Although FIG. 1F illustrates that some of the conductive pads 172 cover neither the conductive wire structures 126 nor the spacer structures 138, in some embodiments those conductive pads 172 may cover the spacer structures 138 but not the conductive wire structures 126. This will be discussed in detail later. In some embodiments, none of the conductive pads 172 cover the dielectric strips 146.

An etching process is performed on the semiconductor memory structure 100 to remove the patterned mask layers 168, as shown in FIGS. 1G, 1G-1, 1G-2, 1G-3 and 1G-4. Next, an etching process is performed on the semiconductor memory structure 100 to remove the fill layer 166 and the spacers 142 of the spacer structures 138, as shown in FIGS. 1H, 1H-1, 1H-2, 1H-3 and 1H-4. In some embodiments, because the fill layer 166 and the spacers 142 are made of the same material, the fill layer 166 and the spacers 142 are consecutively removed with the same etching tool. In some embodiments, the etching process is a wet etching process. Gaps 174 are formed between the spacers 140 and the spacers 144 by removing the spacers 142. The gaps 174 are not shown in FIG. 1H for the sake of clarity. The bottom surfaces of the gaps 174 may be located at a lower level than the first conductive layer 130 and between the bottom surface and the top surface of the conductive material 150.

A protection layer 176 is formed over the semiconductor memory structure 100, as shown in FIGS. 1I-1, 1I-2, 1I-3 and 1I-4. The protection layer 176 is not shown in FIG. 1I for the sake of clarity. The protection layer 176 surrounds and covers the conductive pads 172. The protection layer 176 further covers the spacer structures 138 and seals the gaps 174. The sealed gaps 174 are formed into air gaps 178. The spacer structures including the air gaps 178 are referred to as spacer structures 138'.

Because the spacer structures 138' include air gaps 178, the overall capacitance of the spacer structures 138' can be reduced, which in turn reduced the parasitic capacitance between the contact plugs 164 and the conductive wire structures 126. Therefore, the performance of the resulting semiconductor memory device can be enhanced.

A dielectric structure 180 is formed over the semiconductor memory structure 100 and capacitors 182 are formed in the dielectric structure 180, as shown in FIGS. 1J, 1J-1, 1J-2, 1J-3 and 1J-4. The capacitors 182 pass through the dielectric structure 180 and the protection layer 176 to land on the conductive pads 172. In some embodiments, the dielectric structure 180 includes multiple dielectric materials such as silicon oxide (SiO), silicon nitride (SiN), silicon oxynitride (SiON), and/or a combination thereof. The capacitors 182 may include bottom electrode layers 184 in contact with the conductive pads 172, capacitor dielectric layers 186 over the bottom electrode layer 182, and top electrode layers 188 over the capacitor dielectric layer 186. The bottom electrode layers 184 of the capacitors 182 are electrically coupled with the end portions of the active regions 104 through the conductive pads 172 and the contact plugs 162.

Additional components (such as an interconnect structure, a periphery circuitry, and/or another applicable component) may be formed over the semiconductor memory structure 100, thereby producing a semiconductor memory device. In some embodiments, the semiconductor memory device is DRAM.

In accordance with the embodiments of the present disclosure, the fill layer 166 and the spacers 142 are consecutively removed using the same etching tool to form the air gaps 178, which may omit one etching process and the time period for transferring the semiconductor memory structure. As a result, the manufacturing productivity of the semiconductor memory device can be increased. In addition, the total time of the etching process may be decreased, thereby reducing the negative effect on the conductive pads 172 and/or the contact plugs 164 by the etching process. Furthermore, the transferring of the semiconductor memory structure between different etching tools may be prevented, thereby avoiding the conductive materials from exposing to an oxygen-containing ambient.

The materials, processes and configurations described above with respect to the embodiments of FIGS. 1A through 1J-4 may be implemented to the embodiments of FIG. 2. FIGS. 2-1 illustrates a cross-sectional view of a semiconductor memory structure 200 taken along cross-section A1-A1 shown in FIG. 2. FIG. 2 illustrates the semiconductor memory structure 200 that is similar to the semiconductor memory structure 100 of FIG. 1I. FIG. 2 further shows the spacer 140 and the spacer 144 of the spacer structures 138' and the air gap 178 interposing the spacer 140 and the spacer 144 to illustrate the configuration of the conductive pads 172 and the spacer structures 138'. FIG. 2 shows a conductive wire structure $126_1$ and a conductive wire structure $126_2$ and a spacer structure $138_1'$ and a spacer structure $138_2'$ immediately adjacent to the conductive wire structure $126_1$ and the conductive wire structure $126_2$ respectively. FIG. 2 further shows contact plugs $164_1$, $164_2$ and $164_3$ between the spacer structure $138_1'$ and the spacer structure $138_2'$ and conductive pads $172_1$, $172_2$ and $172_3$ disposed over the contact plugs $164_1$, $164_2$ and $164_3$ respectively.

The conductive pads $172_1$, $172_2$ and $172_3$ are sequentially arranged in a direction that is opposite to the first direction D1. The contact plugs $164_1$, $164_2$ and $164_3$ are sequentially arranged in the third direction D3. In the plan view, the overlapping area of the conductive pad $172_2$ and the contact plug $164_2$ is greater than the overlapping area of the conductive pad $172_1$ and the contact plug $164_1$ and the overlapping area of the conductive pad $172_3$ and the contact plug $164_3$.

The conductive pad $172_1$ partially covers the conductive wire structure $126_1$ and the spacers 140 and 144 and the air gap 178 of the spacer structure $138_1'$. The conductive pad $172_1$ cover neither the conductive wire structure $126_2$ nor the spacer structure $138_2'$. The conductive pad $172_2$ partially covers the spacer 144 of the spacer structure $138_1'$ and the spacer 144 of the spacer structure $138_2'$. The conductive pad $172_2$ does not cover the conductive wire structures $126_1$ and $126_2$. The conductive pad $172_2$ does not cover the spacer 140 and the air gap 178 of the spacer structures $138_1'$ and $138_2'$. The conductive pad $172_3$ partially covers the conductive wire structure $126_2$ and the spacers 140 and 144 and the air gap 178 of the spacer structure $138_2'$. The conductive pad $172_3$ covers neither the conductive wire structure $126_1$ nor the spacer structure $138_1'$.

FIGS. 3-1 illustrates a cross-sectional view of a semiconductor memory structure 300 taken along cross-section A1-A1 shown in FIG. 3. FIG. 3 illustrates the semiconductor memory structure 300 that is similar to the semiconductor memory structure 200 of FIG. 2, except the spacer 144 and the air gap 178 have annular profiles.

After forming the dielectric strips 146, the spacers 142 and 144 (FIG. 1A-1) are formed in the openings 148 which are defined by the dielectric strips 146 and the conductive wire structures 126. As shown in FIG. 3, the spacers 144 and the air gaps 178 (formed by removing the spacers 142) continuously extend along the sidewalls of the dielectric strips 146 and the sidewalls of the spacers 140. The spacers 144 and the air gaps 178 have annular profiles. The conductive pad $172_2$ also partially covers portions of the spacer 144 and the air gap 178 along the dielectric strips 146.

As described above, the embodiments of the present disclosure provide the spacer structure including the air gap, which is formed by consecutively removing the fill layer and the spacer. Therefore, the manufacturing productivity of the semiconductor memory device can be increased. In addition, the negative effect on the conductive material by the etching process can be reduced and the conductive materials are avoided from exposing to an oxygen-containing ambient.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor memory structure, comprising:
forming a plurality of conductive wire structures over a semiconductor substrate;
forming a plurality of spacer structures along sidewalls of the conductive wire structures, wherein each of the spacer structures includes a first spacer and a second spacer, and wherein the second spacer covers a topmost surface and a sidewall of an insulating layer under the conductive wire structures, and a bottommost surface of the second spacer is level with a bottommost surface of the insulating layer;
forming a plurality of dielectric strips across the conductive wire structures;
forming a plurality of conductive strips extending over the conductive wire structures and the dielectric strips;
performing a patterning process on the conductive strips to form a plurality of conductive pads; and
removing the first spacer of each of the spacer structures to form a gap in each of the spacer structures.

2. The method for forming the semiconductor memory structure as claimed in claim 1, wherein the patterning process comprises:
forming a fill layer over the conductive strips;
forming a patterned mask layer over the fill layer; and
etching portions of the fill layer, the conductive strips and the dielectric strips uncovered by the patterned mask layer to form the conductive pads.

3. The method for forming the semiconductor memory structure as claimed in claim 2, further comprising:
removing the patterned mask layer; and
removing the fill layer, wherein the fill layer and the first spacers are consecutively removed using a same etching tool.

4. The method for forming the semiconductor memory structure as claimed in claim 1, wherein the conductive strips extend in a first direction, the dielectric strips extend in a second direction, the conductive wire structures extend in a third direction, the second direction is perpendicular to the third direction, and the first direction is not perpendicular to the second direction or the third direction.

5. The method for forming the semiconductor memory structure as claimed in claim 1, wherein a pitch between the conductive strips is equal to a pitch between the conductive wire structures.

6. The method for forming the semiconductor memory structure as claimed in claim 1, wherein the first spacer is interposed between the second spacer and a third spacer, and wherein a material of the first spacer is different than a material of the second spacer and a material of the third spacer.

7. The method for forming the semiconductor memory structure as claimed in claim 1, further comprising:
forming a plurality of contact plugs in a plurality of openings defined by the conductive wire structures and the dielectric strips, wherein the conductive pads are formed over and corresponding to the contact plugs.

8. The method for forming the semiconductor memory structure as claimed in claim 1, further comprising:
forming a protection layer to surround the conductive pads and seal the gap, thereby forming an air gap.

9. A method for forming a semiconductor memory structure, comprising:
forming a plurality of conductive wire structures over a semiconductor substrate;
forming a plurality of spacer structures along sidewalls of the conductive wire structures, wherein each of the spacer structures includes a first spacer and a second spacer, and wherein the second spacer covers a topmost surface and a sidewall of an insulating layer under the conductive wire structures, and a bottommost surface of the second spacer is level with a bottommost surface of the insulating layer;
depositing multiple conductive materials between the conductive wire structures and over the conductive wire structures;
patterning the multiple conductive materials to form a plurality of conductive strips over top surfaces of the conductive wire structures and top surfaces of the spacer structures;
depositing a fill layer between the conductive strips, wherein the fill layer fills a plurality of trenches between the conductive strips, covers the conductive strips, and has a planar upper surface across the plurality of trenches;
cutting the conductive strips; and
performing an etching process to remove the fill layer and the first spacer to form a plurality of gaps in the spacer structures.

10. The method for forming the semiconductor memory structure as claimed in claim 9, wherein depositing the multiple conductive materials comprises:
depositing a semiconductor layer between the conductive wire structures;
depositing a barrier layer along a top surface of the semiconductor layer, sidewalls and top surfaces of the spacer structures; and
forming a metal layer over the barrier layer.

11. The method for forming the semiconductor memory structure as claimed in claim 10, wherein patterning the multiple conductive materials comprises:
forming a patterned mask layer over the metal layer; and
removing respective portions of the metal layer, the barrier layer, the conductive wire structures and the spacer structures uncovered by the patterned mask layer.

12. The method for forming the semiconductor memory structure as claimed in claim 10, wherein bottom surfaces of the gaps are located at a level between a top surface and a bottom surface of the semiconductor layer.

13. The method for forming the semiconductor memory structure as claimed in claim 9, wherein the fill layer is a dielectric material.

14. The method for forming the semiconductor memory structure as claimed in claim 13, wherein the dielectric material is selected from silicon oxide (SiO), silicon nitride (SiN), silicon oxynitride (SiON), and a combination thereof.

15. The method for forming the semiconductor memory structure as claimed in claim 9, wherein the fill layer and the first spacer are made of the same material.

16. A method for forming a semiconductor memory structure, comprising:
- forming a plurality of conductive wire structures over a semiconductor substrate;
- forming a plurality of spacer structures along sidewalls of the conductive wire structures, wherein each of the spacer structures includes a first spacer and a second spacer, and wherein the second spacer covers a topmost surface and a sidewall of an insulating layer under the conductive wire structures, and a bottommost surface of the second spacer is level with a bottommost surface of the insulating layer;
- depositing multiple conductive materials between the conductive wire structures and over the conductive wire structures;
- patterning the multiple conductive materials to form a plurality of conductive strips over top surfaces of the conductive wire structures and top surfaces of the spacer structures;
- depositing a fill layer between the conductive strips;
- cutting the conductive strips; and
- performing an etching process to remove the fill layer and form a plurality of gaps in the spacer structures, wherein bottom surfaces of the gaps are located at a level between a top surface and a bottom surface of a semiconductor layer.

17. The method for forming the semiconductor memory structure as claimed in claim 16, wherein depositing the multiple conductive materials comprises:
- depositing a semiconductor layer between the conductive wire structures;
- depositing a barrier layer along a top surface of the semiconductor layer, sidewalls and top surfaces of the spacer structures; and
- forming a metal layer over the barrier layer.

18. The method for forming the semiconductor memory structure as claimed in claim 17, wherein patterning the multiple conductive materials comprises:
- forming a patterned mask layer over the metal layer; and
- removing respective portions of the metal layer, the barrier layer, the conductive wire structures and the spacer structures uncovered by the patterned mask layer.

* * * * *